United States Patent
Mack et al.

(10) Patent No.: US 9,466,500 B2
(45) Date of Patent: Oct. 11, 2016

(54) METHOD AND APPARATUS FOR DIRECT FORMATION OF NANOMETER SCALED FEATURES

(71) Applicant: Applied Materials, Inc., Santa Clara, CA (US)

(72) Inventors: James Francis Mack, Woodside, CA (US); Stephen Moffatt, St. Brelade (JE)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/487,356

(22) Filed: Sep. 16, 2014

(65) Prior Publication Data

US 2015/0087136 A1    Mar. 26, 2015

(51) Int. Cl.

| | |
|---|---|
| H01B 13/00 | (2006.01) |
| H01L 21/306 | (2006.01) |
| C23C 16/455 | (2006.01) |
| H01J 37/32 | (2006.01) |
| H01L 21/02 | (2006.01) |
| H01L 21/762 | (2006.01) |
| H01L 21/768 | (2006.01) |
| H01L 21/3065 | (2006.01) |
| H01L 21/67 | (2006.01) |
| H01L 21/68 | (2006.01) |
| H01L 21/285 | (2006.01) |
| C23C 16/04 | (2006.01) |

(52) U.S. Cl.
CPC .......... *H01L 21/306* (2013.01); *C23C 16/04* (2013.01); *C23C 16/45544* (2013.01); *H01J 37/32431* (2013.01); *H01L 21/0262* (2013.01); *H01L 21/02104* (2013.01); *H01L 21/02532* (2013.01); *H01L 21/02636* (2013.01); *H01L 21/28525* (2013.01); *H01L 21/28556* (2013.01); *H01L 21/28562* (2013.01); *H01L 21/3065* (2013.01); *H01L 21/67069* (2013.01); *H01L 21/681* (2013.01); *H01L 21/76224* (2013.01); *H01L 21/76838* (2013.01); *H01J 2237/334* (2013.01)

(58) Field of Classification Search
CPC .......... H01L 21/306; H01L 21/02532; H01L 21/02104; H01L 21/02636; H01L 21/2825; H01J 37/32431; C23C 16/45544; B82Y 30/00
USPC ........ 438/424, 689, 758; 216/11, 62, 66, 72, 216/73
See application file for complete search history.

(56) References Cited

U.S. PATENT DOCUMENTS

| | | | | |
|---|---|---|---|---|
| 6,145,438 | A * | 11/2000 | Berglund | B82Y 10/00 101/463.1 |
| 7,818,816 | B1 * | 10/2010 | Reppert | B82Y 10/00 250/306 |
| 8,580,130 | B2 * | 11/2013 | Mao | B82Y 10/00 156/712 |

\* cited by examiner

*Primary Examiner* — Maki Angadi
(74) *Attorney, Agent, or Firm* — Patterson & Sheridan, LLP

(57) ABSTRACT

An apparatus and use of the apparatus to form nanometer sized features on a workpiece includes a plurality of individually biasable tips, and each tip has a diameter on the scale or 10 nm or less. By moving the tips above the surface of a workpiece in the presence of reactants, features can be directly formed on the workpiece on a sub-micron size, below the resolution of current photolithography. The features may be etched into a workpiece, or formed thereover.

17 Claims, 18 Drawing Sheets

METHOD AND APPARATUS FOR DIRECT FORMATION OF NANOMETER SCALED FEATURES

CROSS-REFERENCE TO RELATED APPLICATIONS

This application claims benefit of U.S. Provisional Patent Application Ser. No. 61/880,521, filed Sep. 20, 2013, which is incorporated herein by reference.

FIELD

The embodiments herein relate to the field of forming sub-micron size features on or in a surface of a workpiece. More particularly, the embodiments relate to formation of nanometer scaled features on or I workpieces, such as semiconductor substrates used in the manufacture of integrated circuit devices, without using the traditional lithographic steps of resist coating, electromagnetic energy exposure of the resist through a mask, developing of the resist, etching of one or more layers of underlying material using the developed resist as a mask, and then removing the mask.

DESCRIPTION OF THE RELATED ART

The unrelenting demand for smaller integrated circuits, coupled with the unrelenting demand for greater density of the devices in these circuits, has resulted in an evolutionary reduction in device half pitch, i.e., one half the distance between adjacent devices on the wafer, to 22 nm today, and a demand to further reduce the half pitch, and size, of devices. To form devices at this spacing, and to enable the interconnection of such features which are spaced at, and sized below, the resolution limit of the 192 nm electromagnetic wavelength used to expose the photoresist, special lithography and masking paradigms have been created. However, although these techniques are capable of forming devices of a size, and spacing, below the resolution limit of the electromagnetic energy used to expose the resist, the variation in the resulting devices is unacceptably high, the yield of good devices is lower than acceptable, and the costs inherent in multiple patterning steps, immersion lithography, and other such special handling steps has resulted in higher costs to manufacture the resulting integrated circuits than is desirable.

Additionally, as the device spacing and size shrinks, the spacing and sizes of the conductive lines and pillars (contacts and vias) used to connect the devices into an integrated circuit are also shrinking. In an integrated circuit having a multi-level interconnect architecture, the spacing and size of the conductors is larger the further the interconnect layer is from the wafer (device layer). As the device size shrinks, the feature size and spacing of the interconnect layer at the device layer likewise shrinks, as do the layers immediately adjacent thereto. As a result, the cost of forming the interconnections between devices increases as well, and the yield, throughput and device quality also decrease as a result of issues in the formation of these interconnect layers.

SUMMARY OF THE INVENTION

The embodiments herein provide for the deposition and etch of sub-micron, nanometer sized features on workpieces, using a microtip array or arrays having individual tips which are individually addressable with an electric potential, to cause a reactant or precursor to locally react in an area immediately adjacent to the individual energized tips, to form a deposit on the workpiece, or to etch an underlying material of the workpiece, with the product of the reaction. In one aspect, the microtip array is configured having thousands to billions of individual tips, and each tip may be individually configured to pass an electrical current therethrough and thereby provide sufficient energy to cause a reactant or reactants to react and form the deposit or etchant. In another aspect, an etching reaction may be accomplished directly on a previously existing material, without the need for a further reactant precursor. In a still further aspect, the embodiments may be used to directly modify nanometer sized portions of a substrate material, or doping such materials at a nanometer scale.

In embodiments herein, a plate having a number of individually biasable tips extending or extendable therefrom (a tip plate), is configured to be selectively positionable over multiple process zones of a workpiece in a continuous or a stop start movement, also known as stepping. At each step, or as the tips are moving, a precursor gas is introduced between tip end and the workpiece, and a voltage potential is applied to selected tips to cause the precursor gas to react, and thus modify the workpiece surface, such as by depositing a reactant result on the workpiece, or etching a portion of the workpiece using the product of reaction, with the portion of the workpiece affected being on the order of the diameter of the end of the tip. Additionally, the tip plate and workpiece are configured for finer movement with respect to one another on the order of less than the diameter of the end of a tip, such that previously formed features may be sequentially partially overwritten, for example when the tip plate is in a stepping mode, to form a line by moving the tips by this finer distance and again applying the potential to again cause a deposit on, or etching of, the workpiece surface. This is repeated, over the surface of the workpiece, to form nanometer scaled features on or in the workpiece surface. The tips have a diameter on the order of 1 to 50 nanometers, more preferably on the order of 1 to 10 nm, and when a voltage is imposed thereon and the tips are closely spaced from the workpiece, such as on the order of 5 to 20 nanometers from a workpiece surface, a precursor located between the workpiece and the tip may be locally broken down into one or more of its constituent elements. In one aspect, the precursor is an ALD precursor, and a layer of the ALD precursor is formed on the workpiece before the voltage is applied to the tip, and the application of the additional precursor and a voltage at the tip causes the ALD reaction to progress, and thus leaves a desired atomic species of the precursor on the workpiece while remaining species of the precursor are vented from the workpiece surface. In another aspect, the precursor(s) are not previously bound to the workpiece, and the voltage potential at the end of the tip causes a deposition or etch reaction involving the precursor to occur at the workpiece surface.

In the embodiments, the tip plate is provided as a least a row of spaced tips disposed along a line, or a plurality of tips arranged in lines, and the lines arranged in adjacent rows, to form a three-dimensional array of individually addressable tips. In one aspect, an array is provided which includes a plurality of rows of tips, wherein the row is at least as long as the largest width dimension of the workpiece surface to be processed, and a plurality of parallel rows are provided over the span of the tip plate. The rows may be spaced at the same pitch (center to center spacing) of the tips, or the row spacing may be different than the spacing of the tips in the rows. Additionally, the tip positions in adjacent rows may be offset from row to row. The tips are individually addressable by interconnection to a transistor array, such as by nanowires, such that an individual transistor in the array is interconnected, at its drain, to an individual one of the tips. The individual transistor gates are selected to open or close based on a controller parameter, to selectively energize individual ones of the tips to cause the reaction of a reactant and the corresponding etch or deposition effect.

The individual tips may be etched from a silicon layer using a patterned resist, a silicon oxide hardmask, and for example a fluorine or chlorine based chemistry, or a mixture thereof, to selectively etch away the underlying silicon to leave extended conical tips on the order of 100 or more nm in height therein. The silicon layer may be provided from a portion of a single crystal substrate, such as a silicon substrate wherein a transistor array for controlling the activation of individual tips has been or will be formed, or from a material layer grown over a transistor array. The individual tips are formed in registration with an interconnect (nanowire) connected to the drain of an individual drive transistor of the array, such that, upon fabrication, each tip is individually addressable and can be charged to a potential via a single transistor of the array. The underlying material in which the tips are formed may be first formed into individual isolation regions, again by patterning a photolithographic mask by e beam lithography, forming individual trenches surrounding each area in which a tip is to be formed, and filling the trench with an isolating material. Thus, an array of nano-dimensioned tips may be formed in electrical isolation from one another, and may be individually addressed with a potential sufficient to cause a reaction of a precursor reactant in an area on the order of the diameter of the end of the tip, to form features on a substrate having dimensions of a scale of the tip.

In another embodiment herein, a tip plate having 100,000 rows and 100,000 columns of tips, wherein the tips are spaced 20 nm apart center to center along a row, provides a tip plate having 10 billion individual tips in an area of 4 square millimeters. The tip plate may be scanned over the workpiece, the workpiece scanned with respect to the tip plate, or they may both move. As the tip plate changes position with respect to the workpiece, the individual tips thereof are individually addressed to impose an electrical potential thereon to cause the deposition or etching reaction. The scanning may be continuous with the potential maintained on the tips, or it may be a stepping arrangement wherein the tips are energized only when the tip plate is stationary, and the tip plate is again stepped or scanned in a fine motion step to a new location before the potential is again applied to the tips.

The tip plate may be used to directly form three dimensional, nanometer dimensioned, features on the workpiece. By imposing a proper voltage on an individual tip of the array, the bonds between the atomic species in a precursor molecule disposed between the tip and the workpiece may be broken or disassociated, resulting in the formation of a deposition or etch species in the small space between the tip and the workpiece. By proper movement of the tips by movement of the array, three dimensional features such as lines may be etched or deposited, all at an nanometer scale, thereby bypassing traditional, electromagnetic wavelength limited, photolithographic processing for the formation of very fine, i.e., very small, workpiece features.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
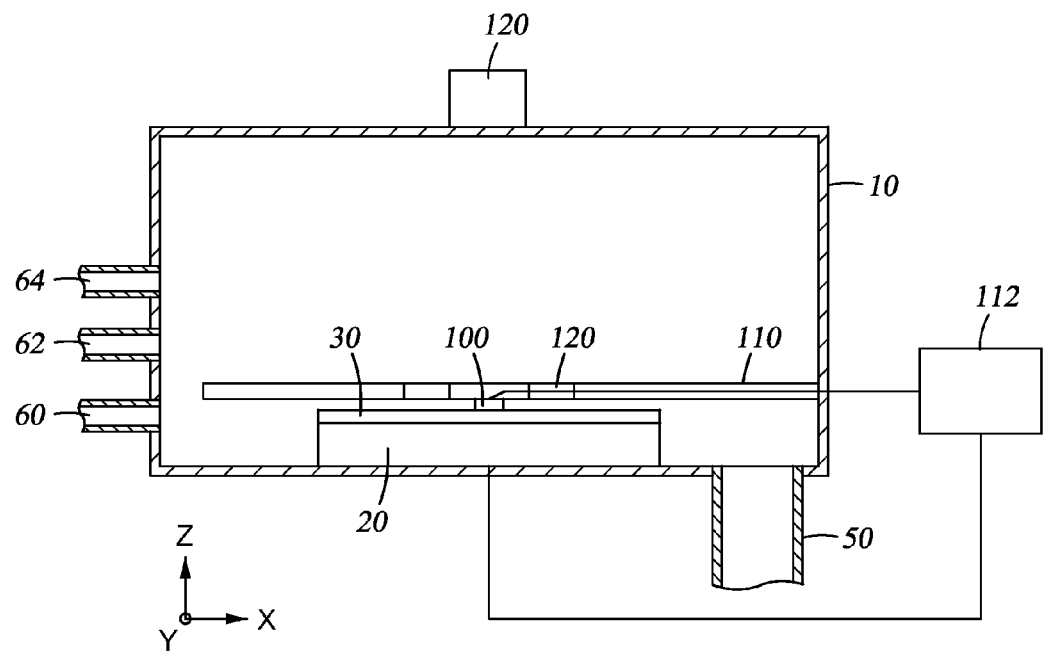
FIG. 1 is a sectional schematic view of a process chamber useful for practicing the embodiments disclosed herein.

Referring to FIG. 1, an isolation chamber 10, in which a workpiece support 20, for replaceably supporting a workpiece 30 thereon, is shown schematically. The chamber 10 is preferably a vacuum chamber, which may be pumped to a low pressure in the $10^{-7}$ to $10^{-9}$ torr range to remove contaminants and potential reactants other than desired reactants, and the chamber may be then backfilled with an inert species such as argon and/or the reactant precursor chemistry(s). Chamber 10 also includes a loading port (not shown), such as a gate or slit valve, through which a workpiece 30 may be placed into, and removed from, the chamber 10 and the chamber resealed by closing of the loading port 40, an exhaust 50 leading to a vacuum pump and facility exhaust system (not shown), and gas inlets 60, 62 and 64, all shown schematically. During use of the chamber 10 to process a workpiece 30 therein, the vacuum pump and exhaust 50 may be used to reduce the internal pressure in the chamber to a sub-atmospheric pressure, and inlets 60 to 64 may be used to introduce gases, such as inert gases and process gases, into the chamber 10. Loading port may be selectively opened to load and unload a workpiece 30 onto and from the support 20, using a robotic or manual loading device, as is well known in the art. Thus, chamber 10 provides a sealable enclosure within which workpieces 30, such as semiconductor wafers, may be serially processed.

Referring still to FIG. 1, tip plate 100 is also provided within the sealable enclosure provided by chamber 10, and is positioned over the workpiece 30 by being supported over support 20 on the underside of shelf 110. In this embodiment, tip plate 100 is configured of a plurality of tips in an equal number of rows and columns fashion, such that a billion individually addressable tips, separated by a pitch of 20 nm from row to row and column to column, is provided. As is shown in FIG. 1, in the embodiment of FIG. 1 the shelf provides a large mass supported from the sidewalls of the chamber 10, and is actively cooled or heated to maintain the shelf, and thus the tip plate 100, at the same temperature as the workpiece 30. A controller 112 is configured to control the movement of the workpiece support 20 relative to the tip plate 100, direct the alignment of the workpiece 30 and tip plate 100, and monitor the temperatures of the workpiece 30 and tip plate 100 and maintain their temperatures at a constant state by active cooling or heating thereon. By motion of the workpiece support 20 in the x and y directions, the tip plate 100 maybe scanned in a plane parallel to the plane of the workpiece, in a spaced relationship with respect thereto. The workpiece support 20 may also be raised and lowered to set a desired spacing between the tips of the tip plate 100 and the workpiece 30. A rotation, or theta adjustment mechanism, may also be provided to change the relative rotational position of the workpiece support 20, and thus the workpiece 30. To determine the relative location of the tip plate 100 and workpiece 30, the shelf 110 also includes a tip plate to workpiece imaging system 120. The tip plate to workpiece imaging system includes a pair of cameras (not shown) configured to obtain an image of the workpiece, to enable alignment of the tip plate 100 to a feature on the workpiece as will be described herein.

Figure 2:
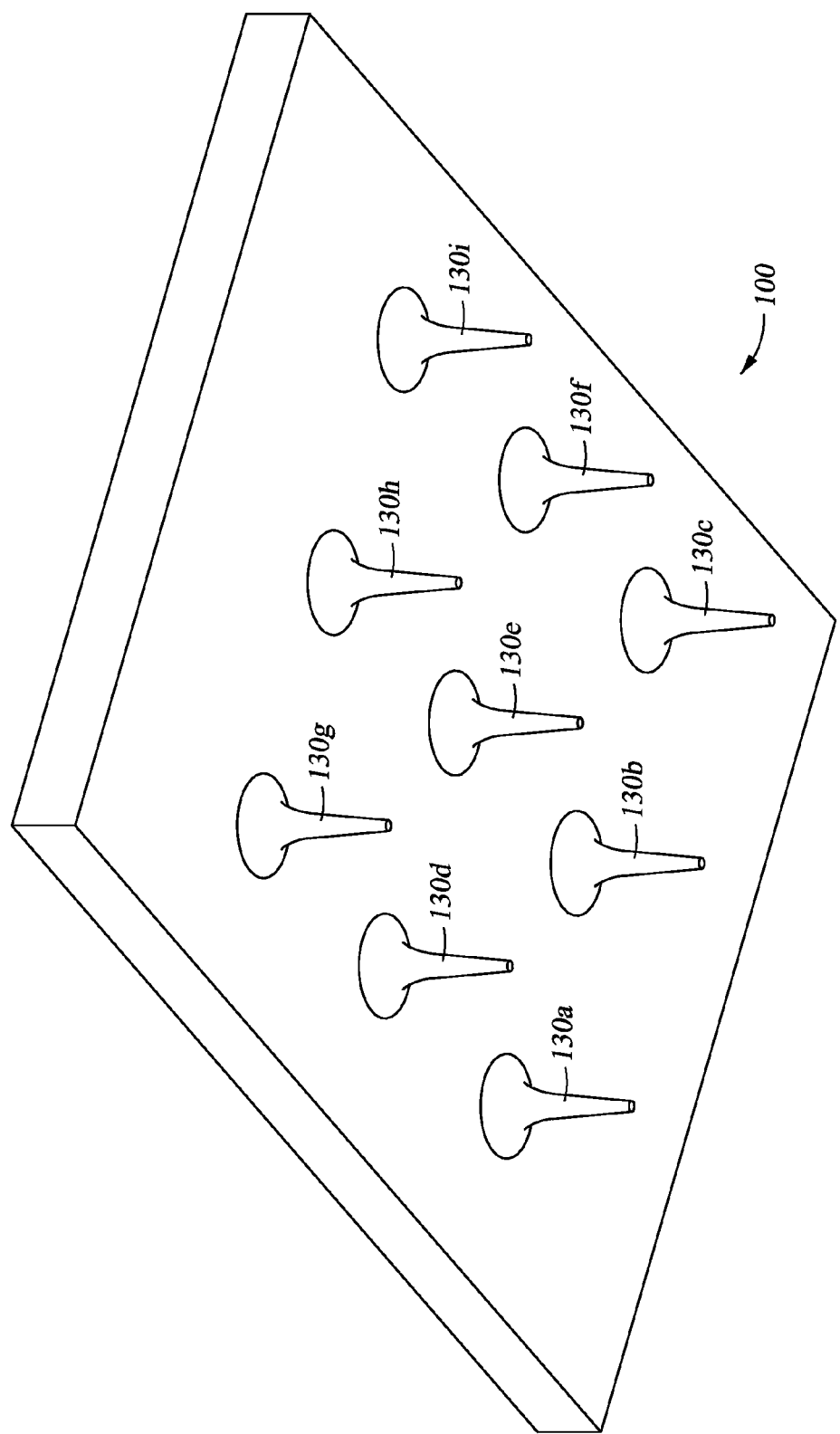
FIG. 2 is a partial perspective view of a tip plate showing the configuration of a plurality of tips thereof.
Figure 3:
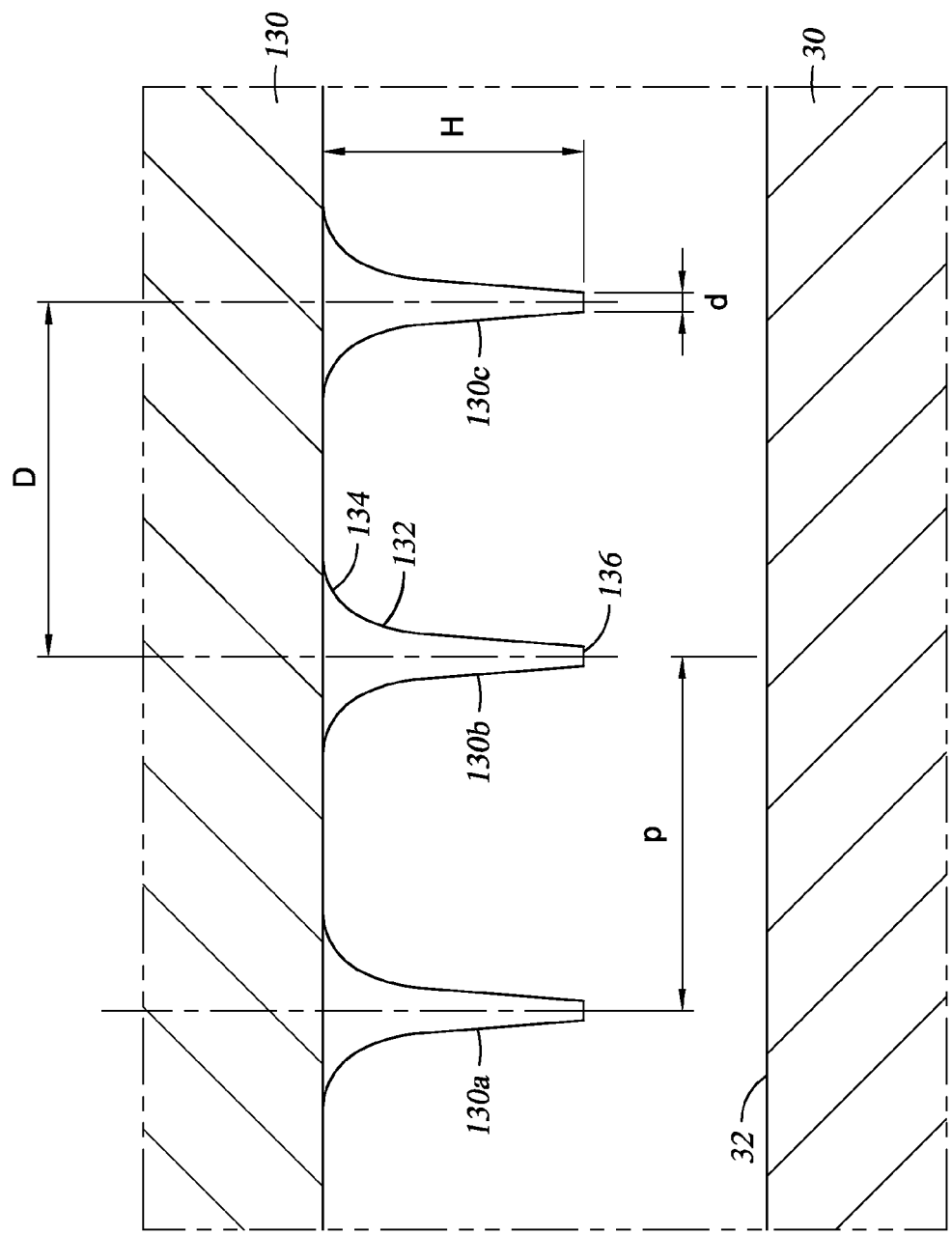
FIG. 3 is a schematic side view of a series of three tips showing the relative spacing between the tips on the tip plate, and of the tip plate and workpiece.

Tip plate 100 is, in this embodiment, on the order of 4 by 4 mm, having a billion individually addressable tips therein. For sake of clarity, only a portion of the tips, in the description herein individual tips 130a-i, are described with respect to the embodiment. As shown in FIGS. 2 and 3, wherein FIG. 2 is a view of a very small portion of the tip side of tip plate 100, a plurality of individual tips 130 a-i are shown, and they extend outwardly from the underside of the tip plate 100. As shown in FIG. 3, each tip 130 includes a shank portion 132 extending from a base 134, and a tip end 136 forming the terminus of the shank portion 132 extending from the base 134. The base 134 of each tip 130 is electrically isolated from the base 134 of the other in the tip plate 100, and they together form an array of individually electrically chargeable (addressable). Additionally, each tip 130 extends from the base 134 by the same height H, and has the same rounded tip 136 diameter "d".

The process position of the tip plate 100 relative to the workpiece is shown in FIG. 3. In the embodiment, the individual tips 130 (only tips 130a-c can be seen) are spaced apart by a pitch P of 20 nm between tip 130 centers, the individual tips extend from the base of the tip plate 100 by a distance H of 100 nm, the tip diameter d at the end thereof is on the order of 5 nm, and the spacing between the tip 136 and the exposed surface 32 of the substrate 30 is about 10 nm. To show detail, the Figure, in particular the spacing from the end 136 of the tips and the workpiece 30, and the diameter of the tips 30 at their end, is not to scale.

Figure 5:
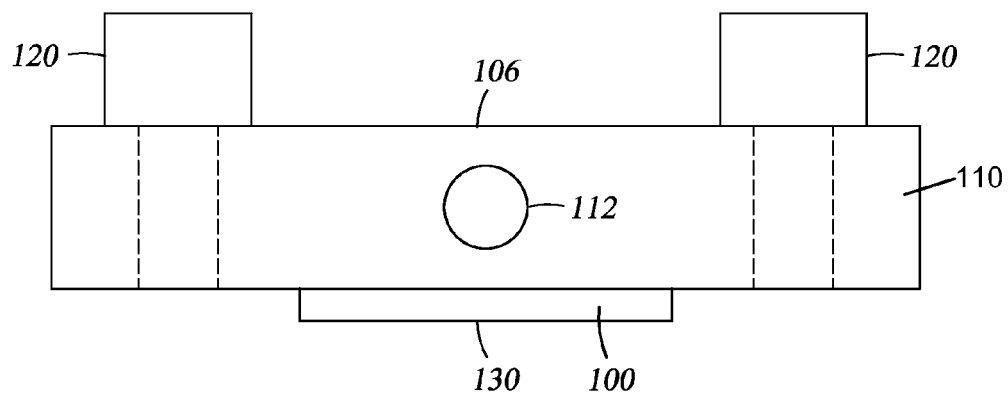
FIG. 5 is a schematic side view of the tip plate.
Figure 6:
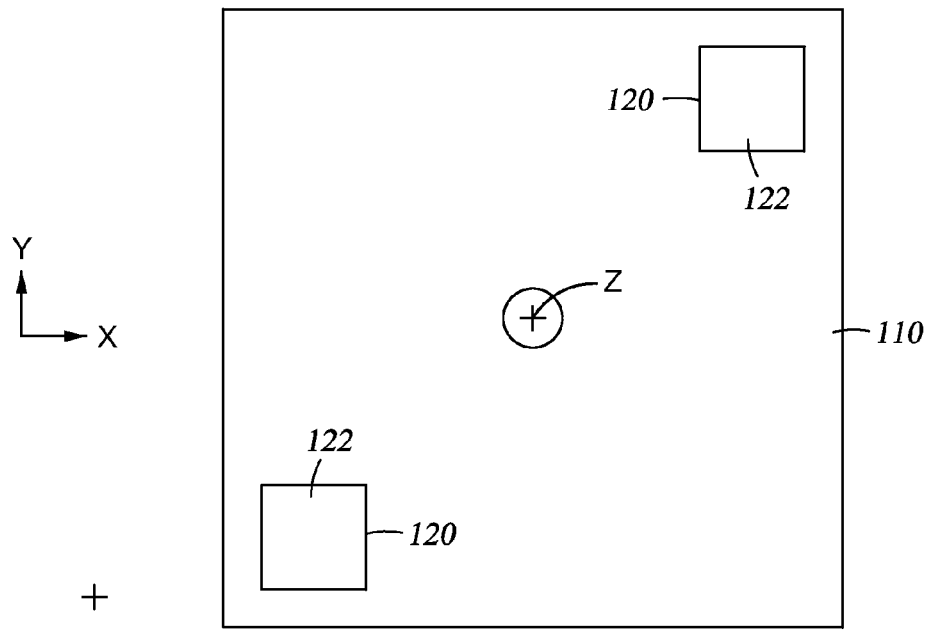
FIG. 6 is a schematic top view of the tip plate.

To finely position the tip plate 100 relative to a desired process position, the workpiece support scans the workpiece 30 with respect to the tip plate 100. The tip plate 100 is positioned over workpiece on the underside of shelf 110, through which cameras 122 extend (FIGS. 5 and 6). As the workpiece surface is scanned under the tip plate 100, an alignment mark (one of marks 138 to 140 of FIG. 4) will pass under the tip plate. Once an alignment mark is encountered, the imaging system causes the tip plate 100 and workpiece 30 to move with respect to each other, to enable at least one of the two cameras to image three different alignments marks, and thereby triangulate the position of the tip plate 100 with respect to the workpiece 30. Then, the workpiece support is moved in the x, y and z directions of FIGS. 1 and 6 to position the tip plate 100 over the desired process position, for example position 200 of FIG. 4.

Figure 4:
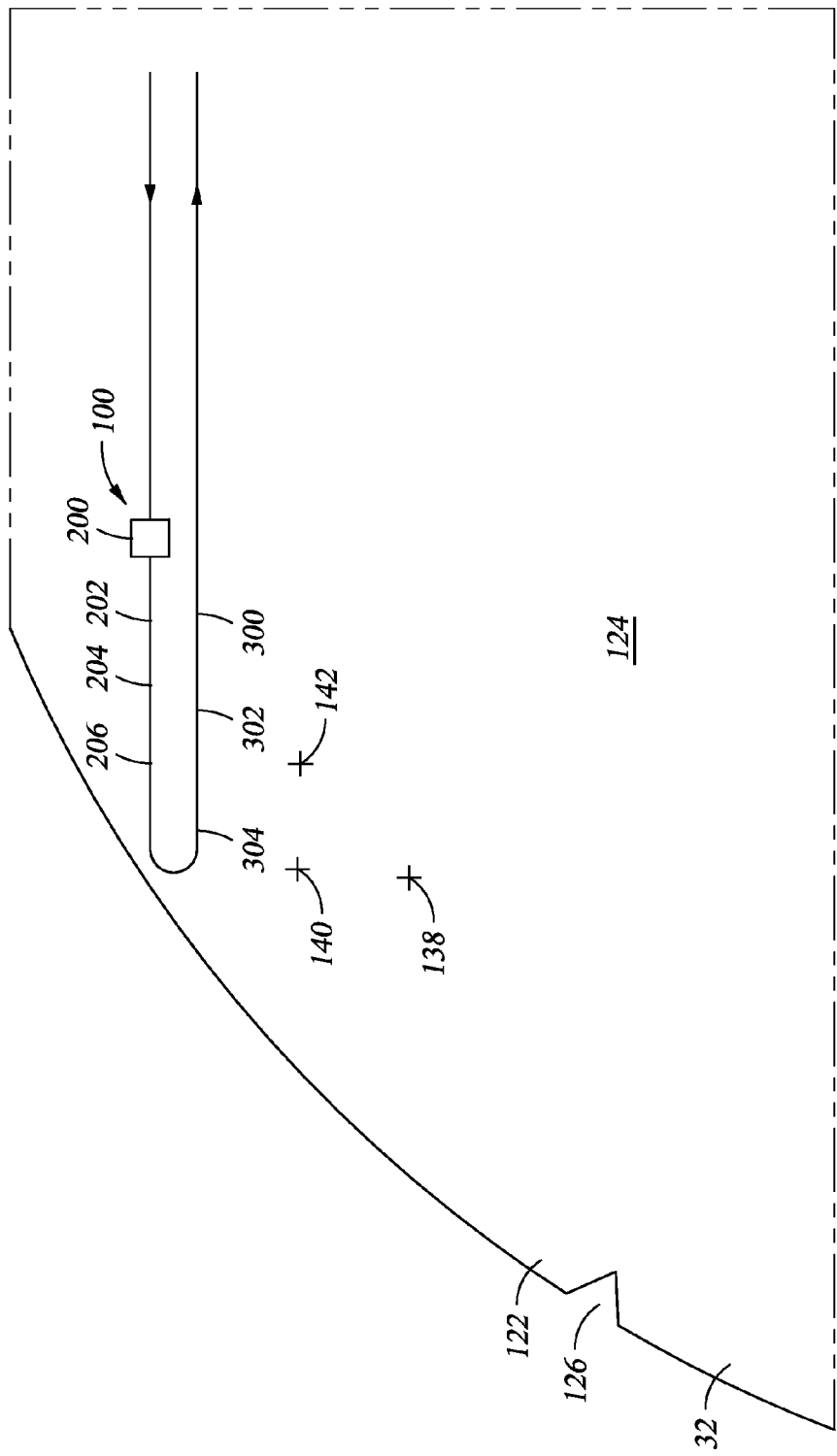
FIG. 4 is a partial plan view of a workpiece showing a tip plate path and alignment features of a workpiece.

Referring now to FIG. 4, the tip plate 100 is shown having a rectangular profile, such that the tip plate projects an "image" of approximately 4 mm by 4 mm on the surface of the underlying workpiece. The tip plate 100 and or the workpiece are moveable with respect to one another, to scan the position of the tip plate 100 with respect to the workpiece 30. In this embodiment, the tip plate 100 is moved along a series of parallel, straight lines paths, such that the position of the tip plate 100 will slightly overlap a prior position thereof over the workpiece 30. Thus, the tip plate 100 may be moved from position 200 to position 202 to position 204 in the x direction of the Figure, and then move in the Y direction to position 304, and thence to position 302 and position 300. The workpiece support is configured to enable the tip plate 100 to be positioned over the entire width of the workpiece, and to likewise be move step wise, between width scans, in the orthogonal direction of the width scans by the width, or less than the width, of the tip array of the tip plate 100.

Imaging system 120 (FIG. 1) is provided to image alignment marks on the workpiece 30 exposed surface, and thereby provide 'rough' alignment of the tip plate 100 to the exposed surface. In the following example, workpiece 30 is a semiconductor wafer, having an edge region (bevel) 122 on which devices will not be formed, and a field region 124 extending inwardly therefrom on and in which devices will be formed. The wafer also includes at least one notch 126 extending inwardly of the bevel 122, and a plurality of alignment marks (marks 138, 140 and 142) shown, which are formed within areas of the wafer on which no device is to be formed, for example the scribe line area where individual chips are cut from a wafer.

Figure 1A:
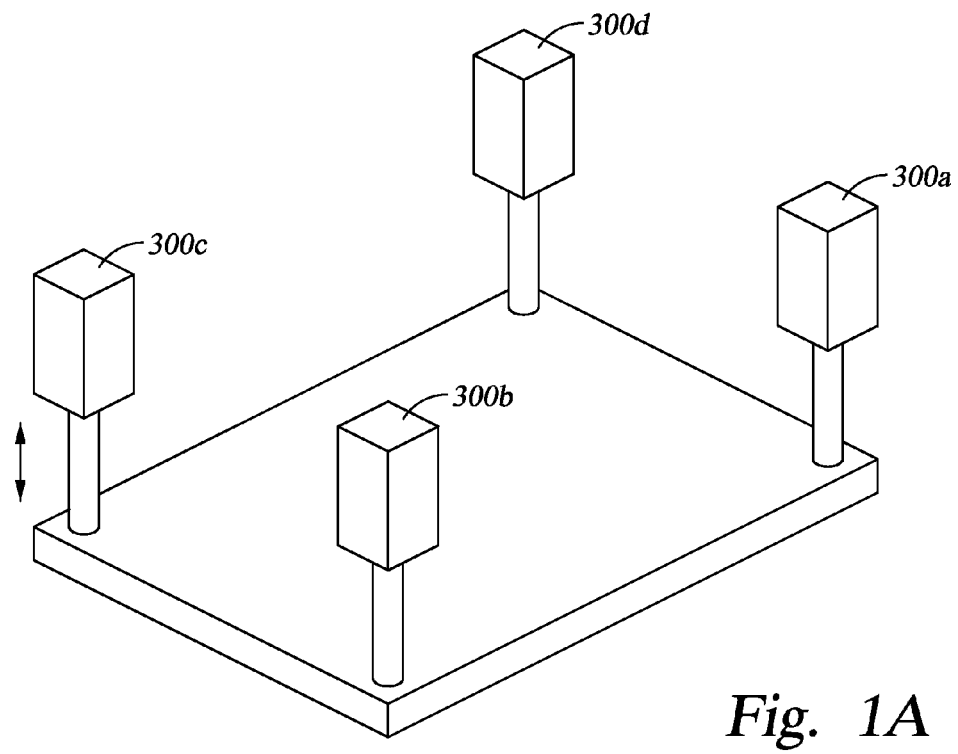
FIG. 1A is a schematic view of a tip plate according to one embodiment.

Additionally, at each position 200, 202, 204 et seq., the relative position of the tip plate 100 and workpiece 30 may be finely adjusted, with relative movement thereof incrementally from less than a nanometer to slightly more than twice the tip spacing of pitch P, to enable writing of three dimensional features on or in the exposed surface of the workpiece. To enable such motion, the tip plate 100 is maintained in a stationary position, and piezoelectric actuators 2030 (FIG. 20) are used to move the workpiece support 20 in the x and y directions. Thus, by positioning tip plate 100 at a desired position over the workpiece exposed surface 32 and individually imposing a selected potential on selected ones of the tips in the presence of a deposition or etch precursor, individual features may be formed on or in the exposed surface 32 of the workpiece. Additionally, as shown schematically in FIG. 1A, the tip plate 100 is supported from the shelf 110 by a plurality of piezoelectric actuators 300a-d, each attached to the tip plate 100 near a corner thereof. The actuators 300a-d are provided to enable alignment of the tip plate 100 such that the individual tips thereof are evenly spaced from the surface of a workpiece. To perform the alignment, the tip plate may be located at a workpiece location in a position approximating the desired spacing of the tip ends from the workpiece, and a deposition or etch reaction using a preselected number and location of tips on the tip plate is undertaken. The tip plate is then moved to enable the imaging system 120 to image the affect of the reaction, and based upon the resulting variation (or non-variation) in the pattern from a desired pattern, the tip plate 100 may be moved closer or further from the workpiece, and, the corners of the tip plate 100 may also be moved different amounts to compensate for location based variation caused by tilting of the plane of the tip ends 136 with respect to the workpiece, on the order of less than a nm by the actuators 300a-d. This procedure may be repeated multiple times at a desired location on the workpiece to stabling the desired orientation of the tip plate 100 and also determine any localized variation in the deposition not caused by tilt. This second variation may be then compensated for in other ways during the deposition or etching process, such as by changing the voltage on individual tips where the deposition or etching would otherwise vary, compensating the stepping distance of the tip plate at that location, or varying the tip to workpiece distance as different tips having different process properties are energized.

To establish alignment of the tip plate 100 to an initial deposition or etch location, a feature is created using the tip plate and the precursor, and the location of that feature (or a plurality of features in a geometric pattern) are imaged by the imaging system 120 and compared to the location of fiducial marks or features on the substrate, and the offset between the desired and actual location of the features is determined. The offset is used to provide a correction to the positioning of the tip plate for deposition. Thereafter, as the tip plate 100 movement exposes the features being formed thereby, the imaging system 120 compares the expected to desired location of the features to enable continuous on-the-fly correction of the tip late 100 location. Further, to help maintain alignment, the temperature of the tip plate 100, and the substrate 2000 being processed, may be closely controlled.

The individual tips 130 of the tip plate 100 in this embodiment are arrayed in a rectilinear grid, wherein the tips are spaced 20 nm apart, center to center, in both the row and the column direction. Thus, once the tip array is positioned over a desired location, the fine position adjustment need only move the workpiece 30, with respect to the tip plate 100, by the spacing between the tips in two normally disposed directions, to enable a tip of the tip array to overlay every position on the wafer. Thus, by incrementally moving the wafer with respect to the tips, three-dimensional features such as lines may we written on the wafer.

Referring now to FIGS. 7 to 12, an example of the use of the tip plate 100 of the tip plate 100, to form a feature on the exposed surface of the wafer, is shown. In these Figures, the features are provided by the breakdown of a precursor molecule to provide an atomic species to deposit on the substrate. The Figures, and accompanying text, provide a description of the use of the tip plate 100 to deposit lines and pillars of a nanoscale size on the exposed surface of the substrate. Again, in these Figures, the use of the tips 130a-i are described, although one skilled in the art will readily appreciate the extension of the description to the entire tip plate 100.

Figure 7:
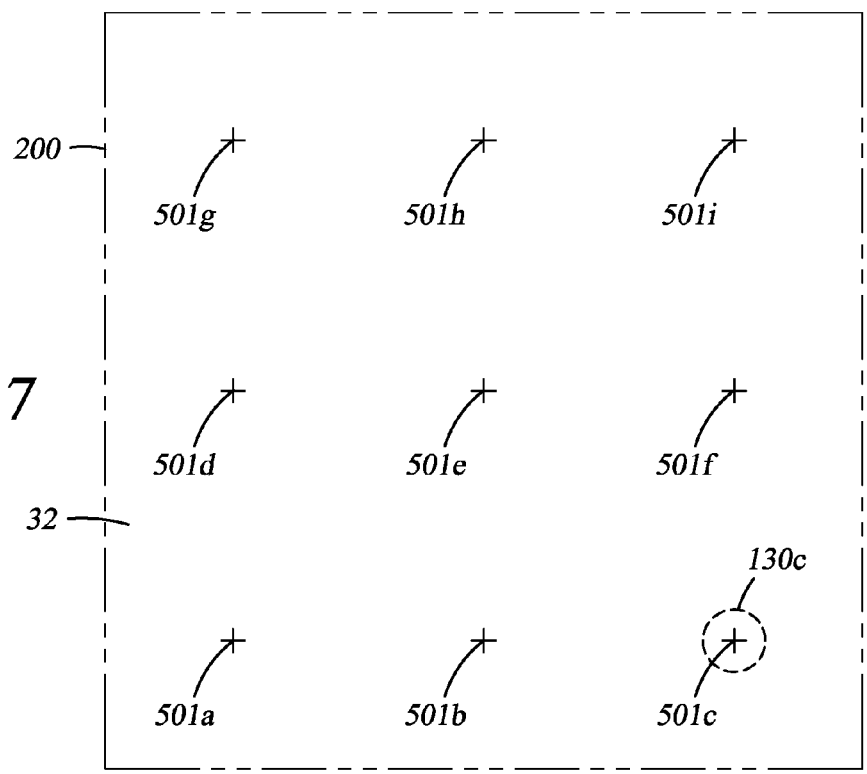
FIG. 7 is a partial plan view of the workpiece, showing a plurality of reference locations thereon.
Figure 8:
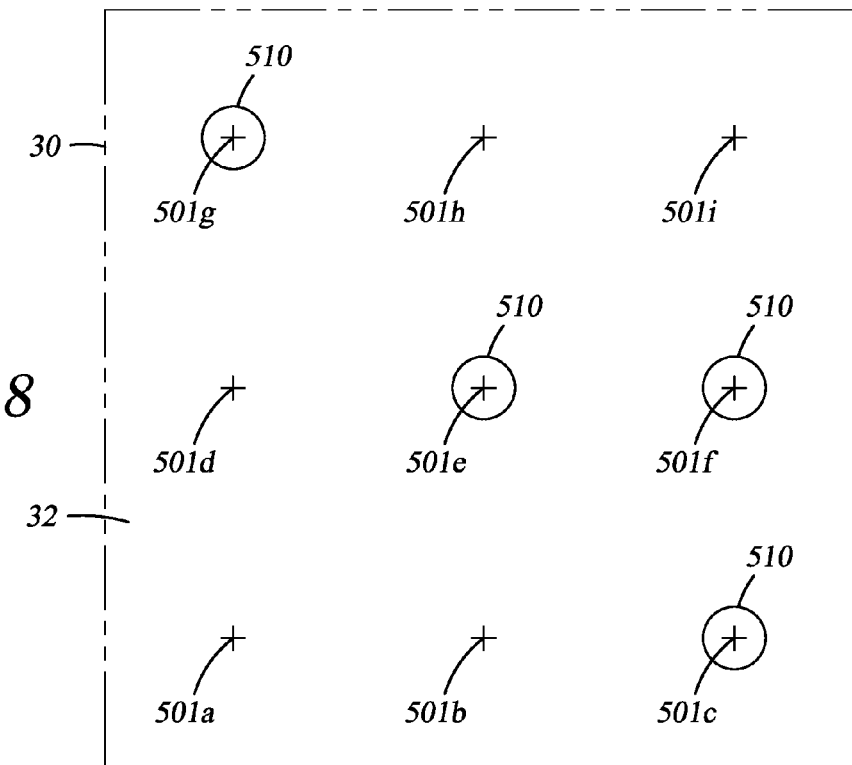
FIG. 8 is the partial plan view of the workpiece of FIG. 7, showing deposition at four locations thereon.

Referring first to FIG. 7, an area of the exposed surface 32 of the workpiece (wafer) 30 is shown, wherein the area shown is slightly larger than the area of the tips 130a-i shown in FIG. 2. For purposes of illustration, the exposed surface 32 includes a number of locations 501a-i, each corresponding to the initial location of a corresponding one of tips 130a-i thereover. As a result, the distance from between the centers of adjacent locations, for example between location 501a and 501b, or between 501a and 501d is the same as the center to center distance of adjacent tips 130, in this embodiment 20 nm. Additionally, as shown in dashed line form at location 501c, the tip 130c overlies the workpiece to cast a 5 nm projection thereon, where the tip has a 5 nm diameter. It is believed the affected region of the workpiece as a result of a reaction with a precursor using the herein will have approximately the same diameter as a tip, and this will be used herein to discuss the operation of the tip plate 100 to write three-dimensional features of the workpiece. Additionally, the individual locations 501a-l correspond to the original locations of one of the tips 130a-i of FIG. 2, where the letter designations show the correspondence, i.e., location 501a is the original position of tip 130a, location 501b is the original location of tip 130b, etc.

The deposition and etching of features using the tips 130 a-i of the tip plate 100 will be now be described with respect. Beginning at FIG. 8, a workpiece having a surface on which a deposition material is to be deposited is provided. The deposition material is used to form lines and individual pillars of deposition material on a nanometer scale through the use of the tip plate 100, by causing a reactant, with the input of electrical energy provided at any individual tip 130, to release therefrom a deposition material such as atoms or compounds of deposition material. In the example of the embodiment, the deposition material is described as Silicon, which may be released from a reactant comprising silane, trichlorosilane, etc. Silane, for example, comprises Silicon and Hydrogen, and upon the input of the proper amount of energy, silicon and hydrogen separate, and the silicon may deposit on the adjacent exposed surface 32 of the substrate 30. Comparing FIGS. 7 and 8, four deposition regions 510, each having a diameter on the order of 5 nm, have been deposited on the exposed surface 32 of the workpiece 30. These deposits are formed at location 501c, e, f and g, by imposing a potential capable of breaking down a silane based precursor on only c, e, f and g, and maintaining tips 501 a, b, d, h and i in a grounded or floating state.

Figure 9:
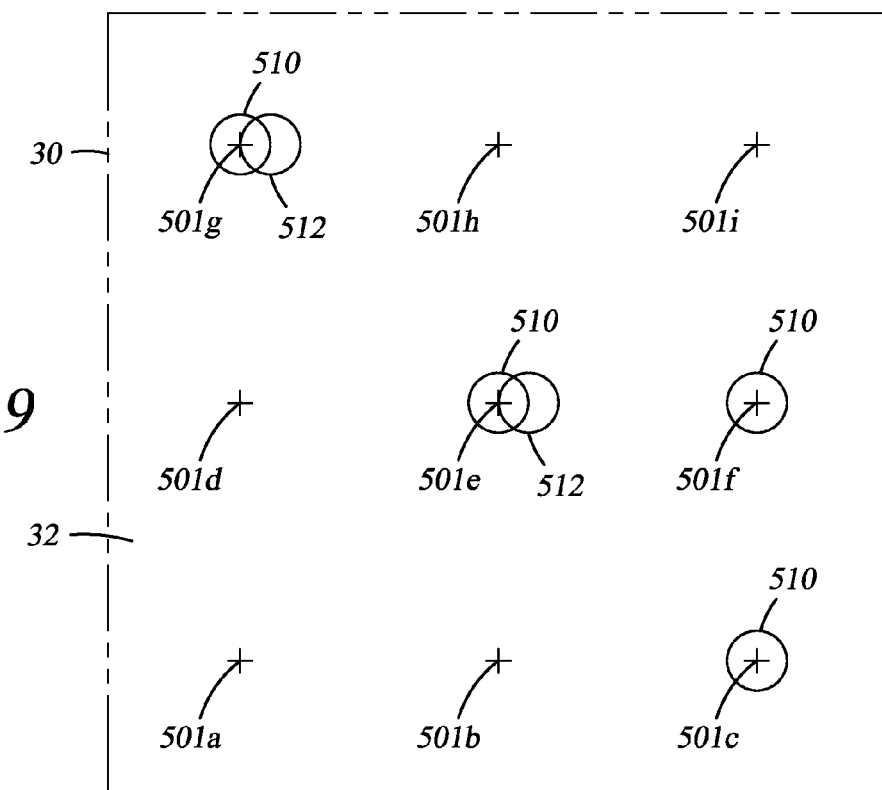
FIG. 9 is the partial plan view of the workpiece of FIG. 8, showing additional deposits thereon to begin the forming of deposited lines on the exposed surface of the workpiece.
Figure 10:
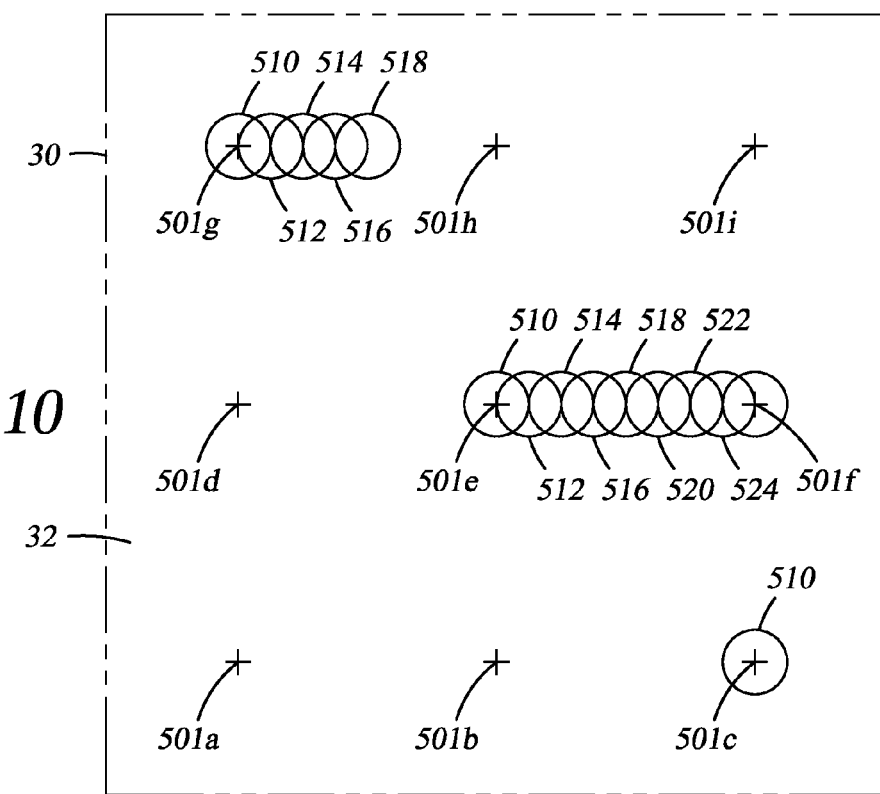
FIG. 10 is the partial plan view of the workpiece of FIG. 9 showing a line spanning two reference positions and a partially completed line, as well as a single deposition at one reference position.

Referring now to FIG. 9, the effect of further processing of the workpiece is shown. In the Figure, only two additional deposition regions 512 can be seen adjacent to, and partially overlapping the previously deposited material deposited at location 501e and 501g. The remaining locations remain in the condition following the step illustrated at FIG. 8. This is provided by moving the workpiece to the left in the Figure by about one-half the diameter of the tips, and energizing only e and g to provide a deposit overlying the previously formed deposit. Referring to FIG. 10, there are shown a plurality of further deposits along the trajectory to the right of the Figure. The additional deposits made in FIGS. 9 and 10 were likewise created by breaking down the silane precursor, and the workpiece support has incrementally moved the workpiece to the left of the Figures (x-direction of FIG. 6) by one-half the tip diameter after each deposit was formed, and only e and g had a potential thereon.

As is seen in FIG. 10, a total of five deposits were made extending from original location 501g by imposing a potential on tip 130g at the initial deposition location and at four additional sequential steps, and a total of seven deposits 510 to 524 were made to connect a line between original position 501e with the deposit 510 made at location 501f, to form an interconnecting line therebetween. Without considering the effect of scalloping occurring along the sides of the resulting lines, lines on the order of 5 nm wide, and for example over 20 nm long as extends between locations 501e and 501f, may be formed.

Figure 11:
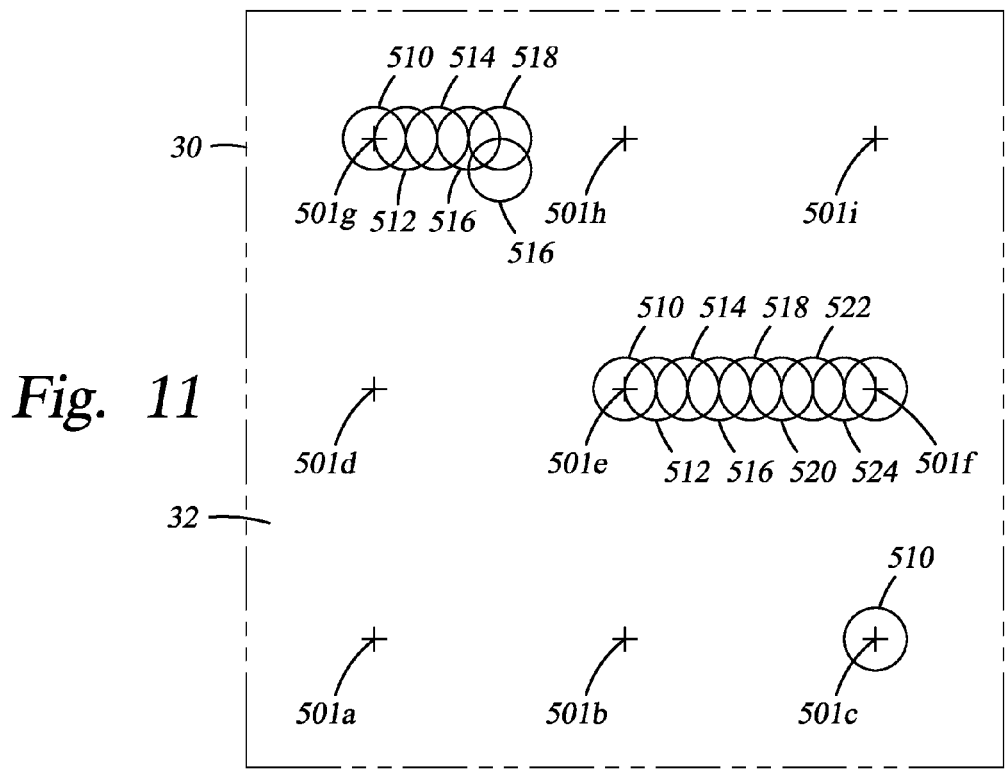
FIG. 11 is the partial plan view of the workpiece of FIG. 10 showing further deposition to further define the partially completed lines.

Referring now to FIG. 11, one can see the effect of moving the workpiece in a direction upwardly and downwardly on the page, (direction Y of FIG. 6) in this case, upwardly on the page to position the tip 130g to the right of, and below, the original position 501g to form deposit 326 as shown. Continued motion of the workpiece support toward the top of the Figure (page) will result in additional deposits, thereby forming an L shaped line. Additionally, by incrementally moving the workpiece support in both directions simultaneously, or sequentially before the next deposit is formed, a line running along a diagonal of the Figure may be written.

Figure 12:
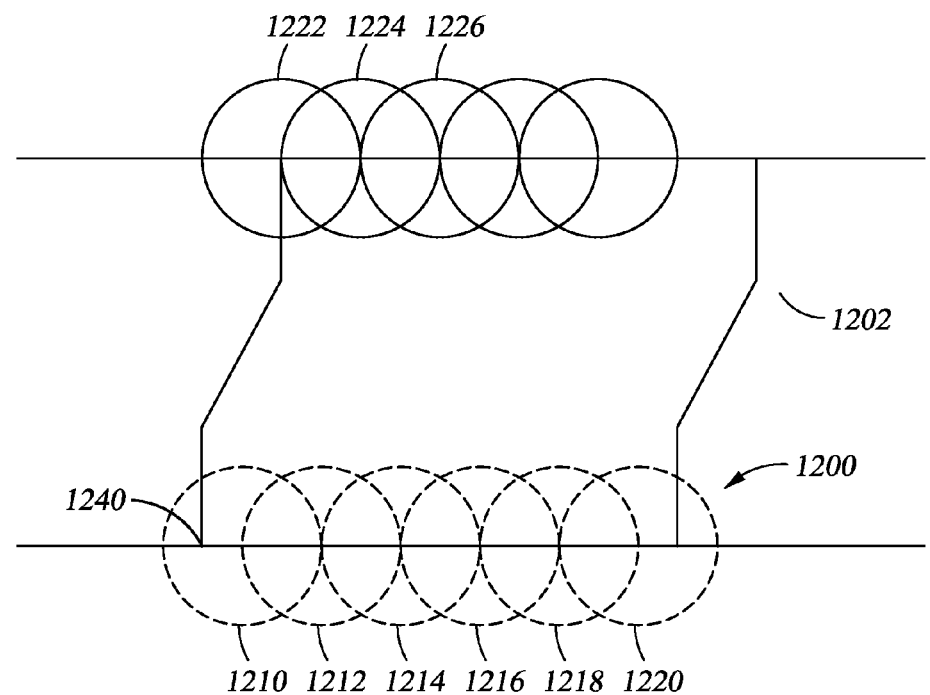
FIG. 12 is a schematic view of a second line being deposited over a prior a deposited line to increase the thickness thereof, wherein the second line is offset from the position of the first line on offset lines to better show the relative position of the deposits at each tip deposition position.

It is contemplated herein that using a tip diameter of 5 nm, a one to three atom thick layer of a corresponding approximately 5 nm diameter can be formed during each deposition step. To form a line of a finished thickness thicker than a few atoms as measured from the exposed surface 32 of the substrate 30, a previously formed line may be overwritten, as shown in FIG. 12. In FIG. 12, the originally written line 1200 is shown in dashed outline, comprising six deposits 1210-1220 having a diameter on the order of 5 nm, aligned in a straight line path, and the second line is shown spaced from the first line for clarity only, and the alignment thereof to the first line 1200 is along offsets 1240, 1240'. In the first deposited line 1200, at each deposit step, the tip plate 100 is moved in the same direction, by one-half of the tip diameter. Thus, the edge of deposit 1212 extends to the center 1242 of the first deposit 1210. This results in a line having a thickness of a few atoms which has a scalloped side wall profile, and variation in thickness across its width as some portions of the line are formed of a single deposit and others are an overlay of two deposits.

To provide a more uniform sidewall profile (i.e., to reduce scalloping), the second line to be overwritten on the first deposited line is offset such that the center of the first of the second deposits is offset to a location 1242 between the center and edge of the first deposit 1210 of the first line 1220, and each subsequent one of the second deposits 1224, etc., are centered over the edge of the previous deposit of the first line. To form the final thickness line, several such overwrittings are contemplated, and a slight offset in the position of the center of the overlaying deposits to a location between the edge and center of an underlying deposit will result in greater thickness uniformity, and reduced scalloping, by slightly modifying the overlay regions of each subsequent deposit. Additionally, to write a thicker line with less scalloping, the tips may be moved by less than one-half the diameter of the previously deposited material.

To etch features using the tip plate 100, instead of a deposition precursor, such as silane, an etching precursor selected to etch a film layer is provided. The positioning, stepping and aligning of the tip plate 100 remain the same, and the individual a-n remain independently biasable as with the deposition example. For example, to etch features into silicon, an HF precursor is introduced into the chamber 10, after the tip plate has been arranged at a location where a silicon feature is to be formed from an underlying film layer. FIGS. 13 to 19 show a sequence of etchings to form a three dimensional feature shown in dashed line outline in FIGS. 13 and 14, within the underlying silicon material layer.

Figure 13:
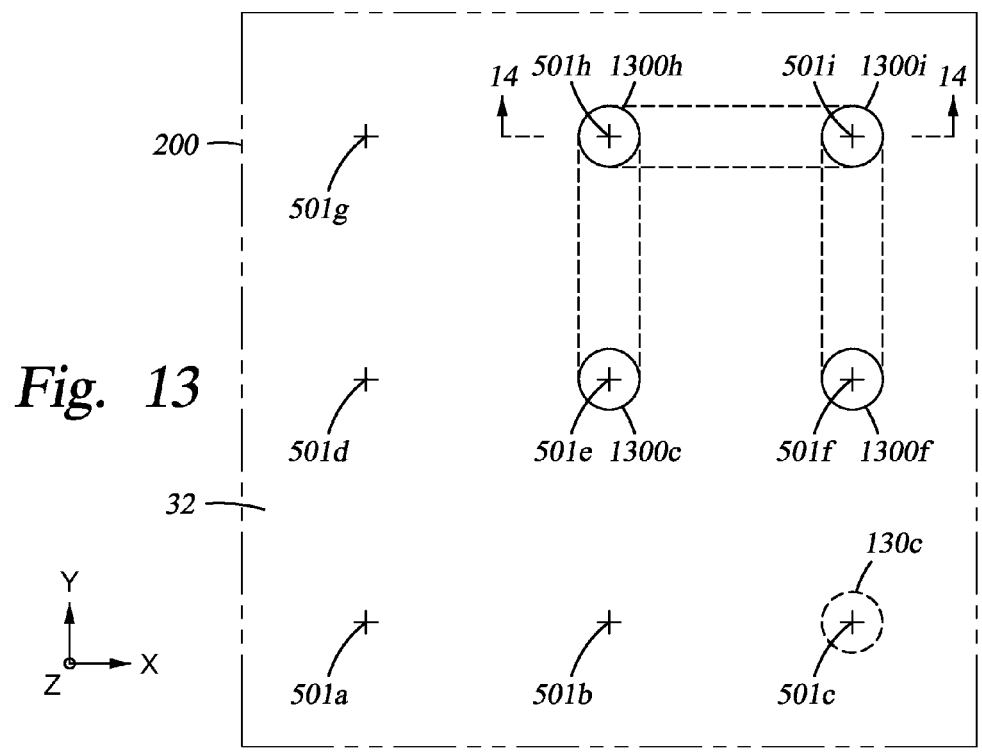
FIG. 13 is a partial plan view of a workpiece shown the location of four localized etchings therein.
Figure 14:
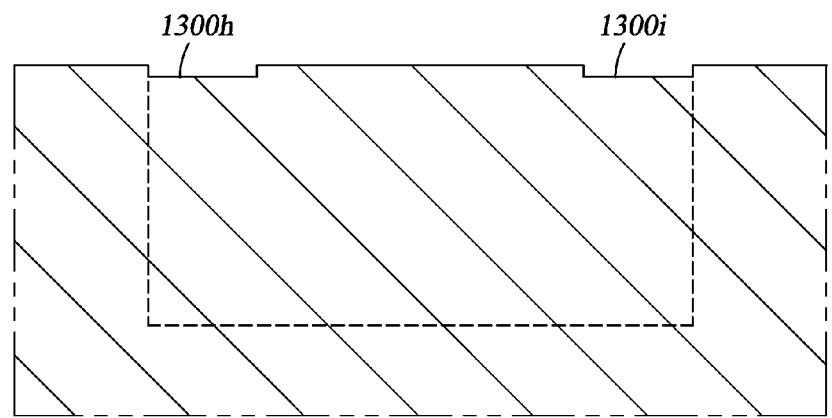
FIG. 14 is a sectional view of an etched feature of FIG. 13 at section 14-14.
Figure 15:
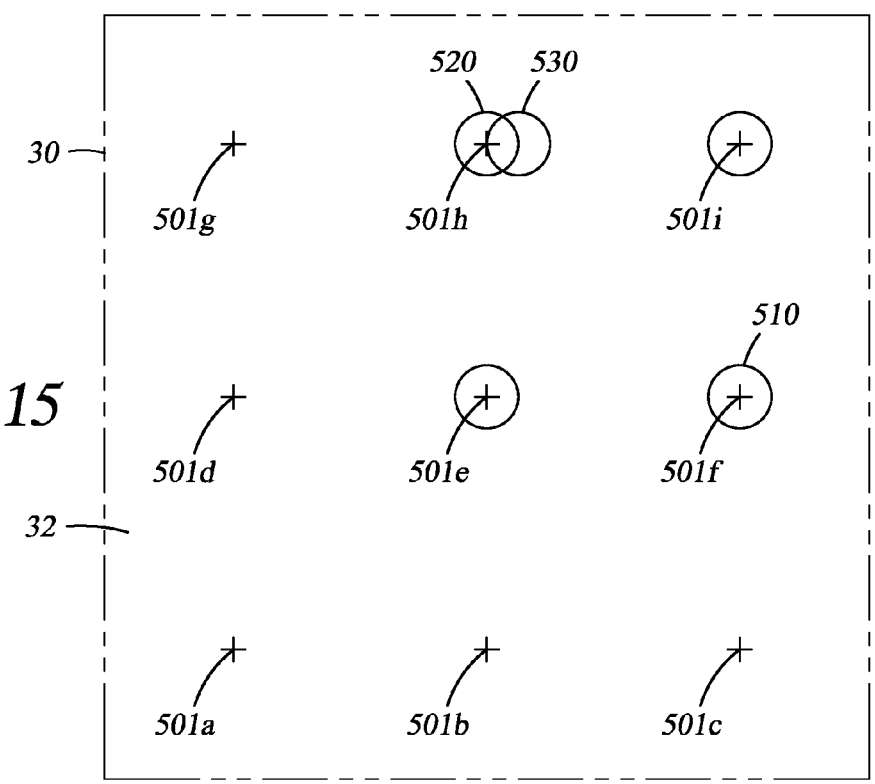
FIG. 15 is the partial plan view of the workpiece of FIG. 13, showing further etching thereof.
Figure 16:
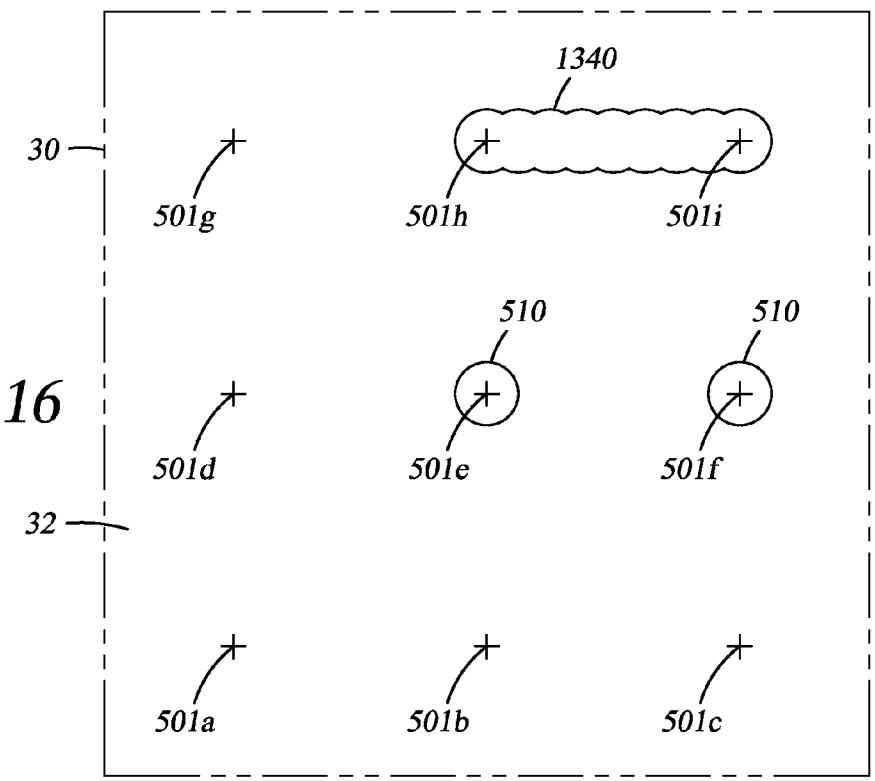
FIG. 16 is the partial plan view of the workpiece of FIG. 15, showing a line having been etched into the surface thereof.
Figure 17:
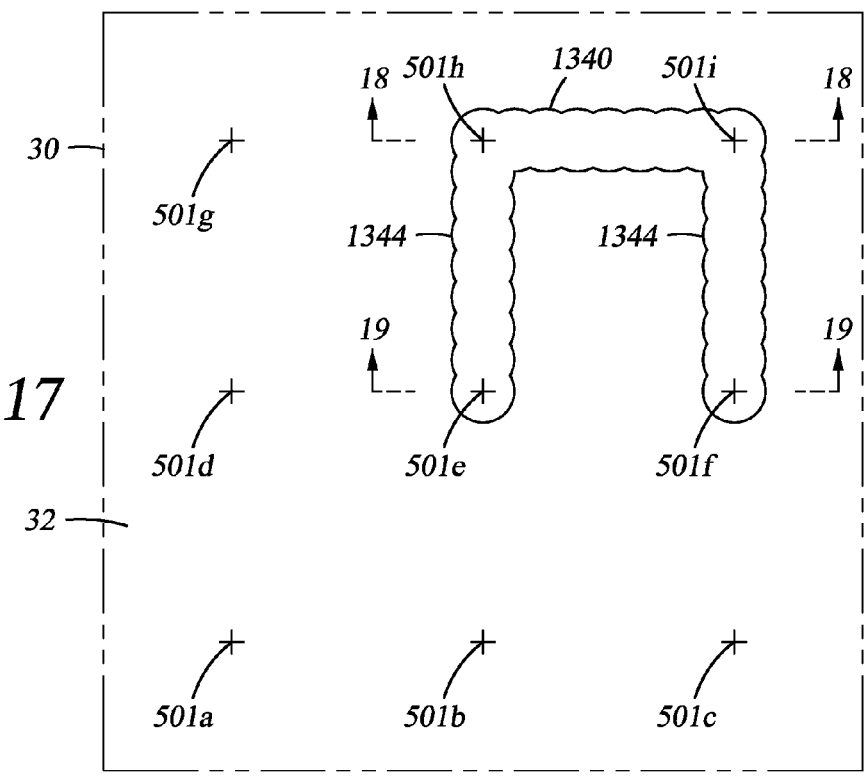
FIG. 17 is the partial plan view of the workpiece of FIG. 16 showing a U-shaped trench or line having been etched into the exposed surface thereof.
Figure 18:
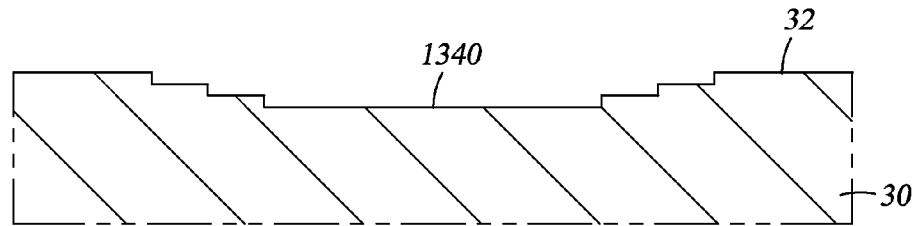
FIG. 18 is a sectional view of the workpiece of FIG. 17 at section 18-18.
Figure 19:
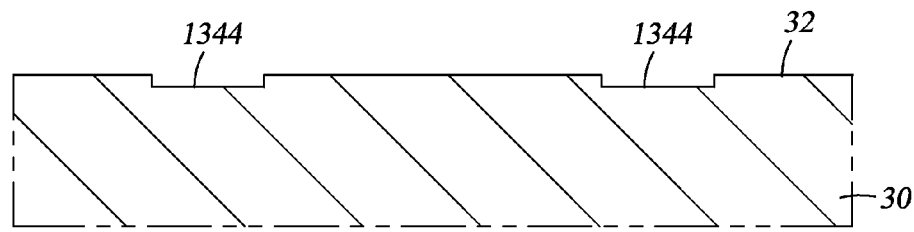
FIG. 19 is a sectional view of the workpiece of FIG. 17 at section 19-19.

Referring to FIGS. 13 and 14, and using the same coordinate system and relative locations of a-l with respect to positions 501a-l, the result of a first etching step is shown. In this example, HF was introduced and a bias of approximately 10 volts is applied to e, f, h and i, resulting in etching of generally circular recesses 501 e, f, h and l of one to several silicon atoms deep into the silicon of exposed surface 32 at locations 501e, f, h and i. Thereafter, as shown in FIG. 15, after moving the workpiece by one-half the diameter of the tips, the tip 130h associated with location 501h is biased to cause the etchant to react, and thereby etches a further generally circular area into the exposed surface 32. Note that as a result of the previous etching step, the area of overlap of the two etched locations or circle extends deeper into the silicon that do the areas of non-overlap. Then, this incremental movement by about one half the tip diameter is repeated, until an etched trough or trench extends inwardly of the exposed surface 32 is a generally straight line path from location 501h to 501i, and shown in FIG. 16. Then, the relative position of the tip plate 100 and workpiece 30 are returned to the position where the four etchings 1300 *e, f h* and *i* were performed, and then moved in the Y direction to cause h and 130*i* of FIG. 2 to overlie the dashed line positions shown in FIG. 17, at which point voltage is applied to the h and l causing an opening having a few atoms of thickness to form in the underlying etched surface corresponding to the dashed line outline location. The workpiece 30 is again moved in the Y direction relative to the tip plate 100 by about one-half the diameter of the tips, and the etching step is repeated. The etching steps are repeated until an etched line 1342 and 1344 extends from either end of the previously formed line 1340. The above steps are repeated until a desired depth of the line is formed. By offsetting the center of the tips involved in etching of the lines from the position of the tip in the previously etched line location, the scalloping of the side walls of the lines 1340-1344 is reduced. In further etch steps, the tips are moved incrementally closer to the workpiece to maintain an equal distance between the base of the etched feature and the ends of the tips. This need not occur in every etching step, but after 1 to 5 etchings of the complete line.

In another embodiment, an ALD (atomic layer deposition) layer may be formed as a continuous layer on the surface of the substrate, and the energy of the tips uses to selectively cause the two or more components to react at the location of a tip, thereby selectively causing full ALD reaction at that location. The forming of the ALD layer may be provided by pulsing two (or more) different precursors at a temperature below the ALD reacting temperature, followed by providing a bias on one or more tips to supply sufficient energy for the deposition reaction to go forward adjacent to the biased tip, but insufficient to activate the precursors into a full CVD mode. Additionally, the pulsing of the precursors to form the ald layer, and the depositing of a film layer by selective location ALD thereof, can occur at different times. Further, the tip potential may remain at a reactant potential which the tip is moving, potentially resulting in a more uniform line thickness and wall profile. This may also be performed in the previously described etch and deposition embodiments herein, where the tip potential may remain to continuously write lines and features on the workpiece. However, in a cvd and etch mode where an previously positioned monolayer of reactant atoms is used as in ALD to supply the reactant species, this could lead to less uniform features based on the available precursor molecules at any given location on the workpiece, the speed of movement of the tips, the rate at which the precursors are replenished, etc. In any event, the intent herein is to provide the gaseous species into the chamber such that spontaneous reaction does not occur, and using the tip potential to drive the desired reaction to conclusion.

Additionally, although the number of tips and tip positioning by the tip plate 100 were discussed herein, for ease of understanding, with respect to the nine a-l in the tip plate 130, each of the individual a-n is intended to operate in the same fashion as those described, to enable the manufacturer of an integrated circuit device to form dielectric, semiconductive and conductive line, vias and contacts using gas precursors and tips of an appropriate size. It is contemplated herein that the materials deposited following the teachings hereof may be used directly in a finished integrated circuit, or, they may be used as mask layers to pattern etch materials they are ultimately formed over.

Referring again to FIG. 4, after performing the above described etching of deposition steps at position 200, the workpiece 30 and tip plate 100 are repositioned with respect to each other, such that the tip plate 100 is repositioned from position 200 to position 202 over the exposed surface of the workpiece 20. The movement of the workpiece support is on the order of slightly less than the length of the tip array 13, such that in the new position, the imaging system 120 can locate features previously written or existing on the workpiece, and additional segments of such features may be formed in location 202 to continue the feature from location 200. Again, the imaging system 120 can locate workpiece features such as alignment marks, or previously formed deposition or each features, and as required, move the workpiece to position individual tips for forming locations at desired locations on or in the exposed surface 32 of the workpiece 30. Likewise, the tip plate will be repositioned to accommodate any "tilt" misalignment, and the tips again mapped to locate regions of non-uniformity that cannot be compensated for by adjustment of tilt alone.

Figure 20:
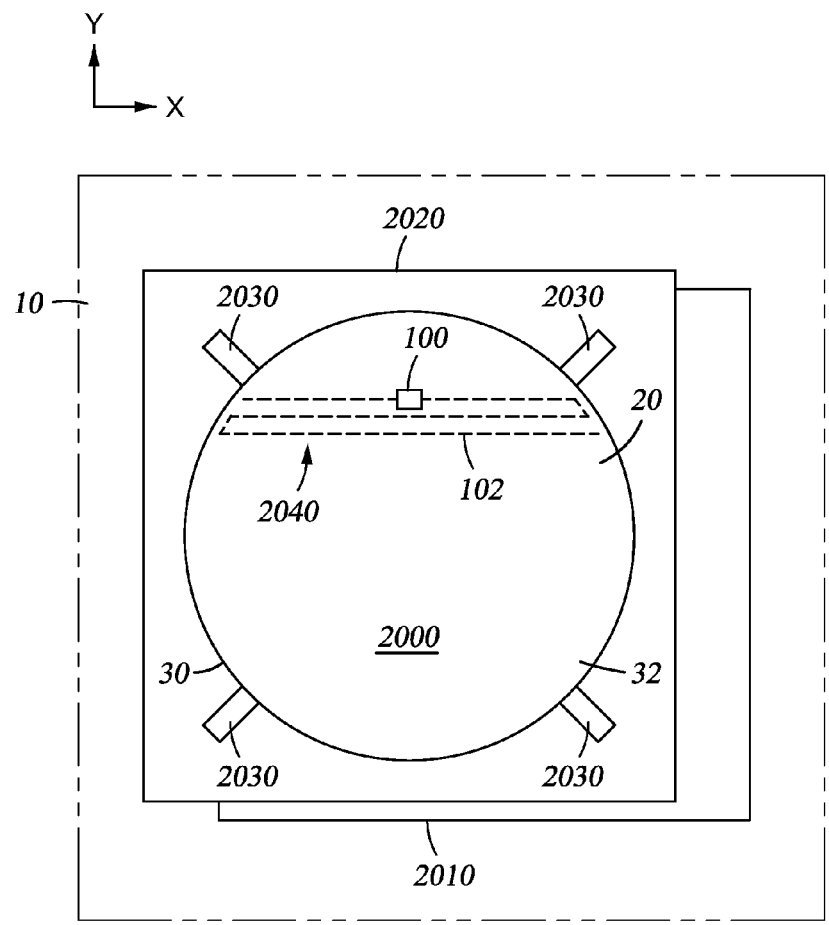
FIG. 20 is a plan view of one embodiment of the workpiece support of FIG. 1.
Figure 21:
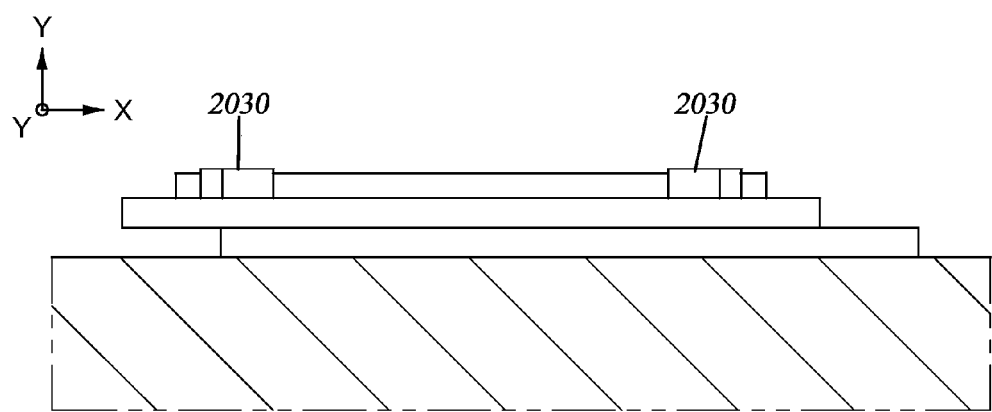
FIG. 21 is a side view of the workpiece support of FIG. 20.

Referring now to FIGS. 20 and 21, there is shown a schematic view of a workpiece support 20 specifically configured to hold a workpiece 30 such as a semiconductor substrate 2000 thereon, and precisely position substrate with respect to a tip plate 100.

The support 20 is positioned on the base of chamber 10, and includes a first moveable base 2010, a second moveable base 2020 moveable perpendicularly to first moveable base, and a plurality of, in the embodiment shown four, piezoelectric actuators 2030 evenly spaced around the circumference of the substrate 2000. First moveable plate 2010 plate is configured to be controllably moveable in the X direction of the Figure with respect to the base of chamber 10, such as by a linear motor coupling the base of chamber 10 and first moveable plate 2010. Second moveable plate is moveably mounted on or over first moveable plate 2010 and coupled thereto by a linear motor, such that second moveable plate 2020 is moveable in the Y direction orthogonal to the x direction. Finally, the workpiece support 20 is slidably supported on the second moveable plate 20120 by movement with the piezoelectric actuators 2030 which connect the second moveable plate 2020 and the workpiece support 20. An elevator, not show, may be incorporated into either of the moveable plates 2010, 2020 to enable z position adjustment. Also shown is tip plate 100, overlying a portion of track 102 over which the tip plate 100 will be positioned over the substrate 2000 for the forming of features thereon or therein. Track is shown in dashed line outline, and only partially shown, and is merely for illustration of one track the tip plate encounter by movement of the workpiece.

In this embodiment, the location of the tip plate 100 is fixed in space, and only the substrate, by virtue of x, y and z motion is able to move under the tip plate 100 position. Thus, initial positioning of the substrate with respect to the tip plate 100 is accomplished by aligning the movable plates to move the substrate having alignment marks thereon to the tip plate, and then using the imaging system 122 of the tip plate 100 to cause alignment of the local position of the substrate 2000 to the desired position of the pins 130 *a-n* with respect thereto, followed by processing as was described herein to form desired features on or in the substrate 2000.

Figure 22:
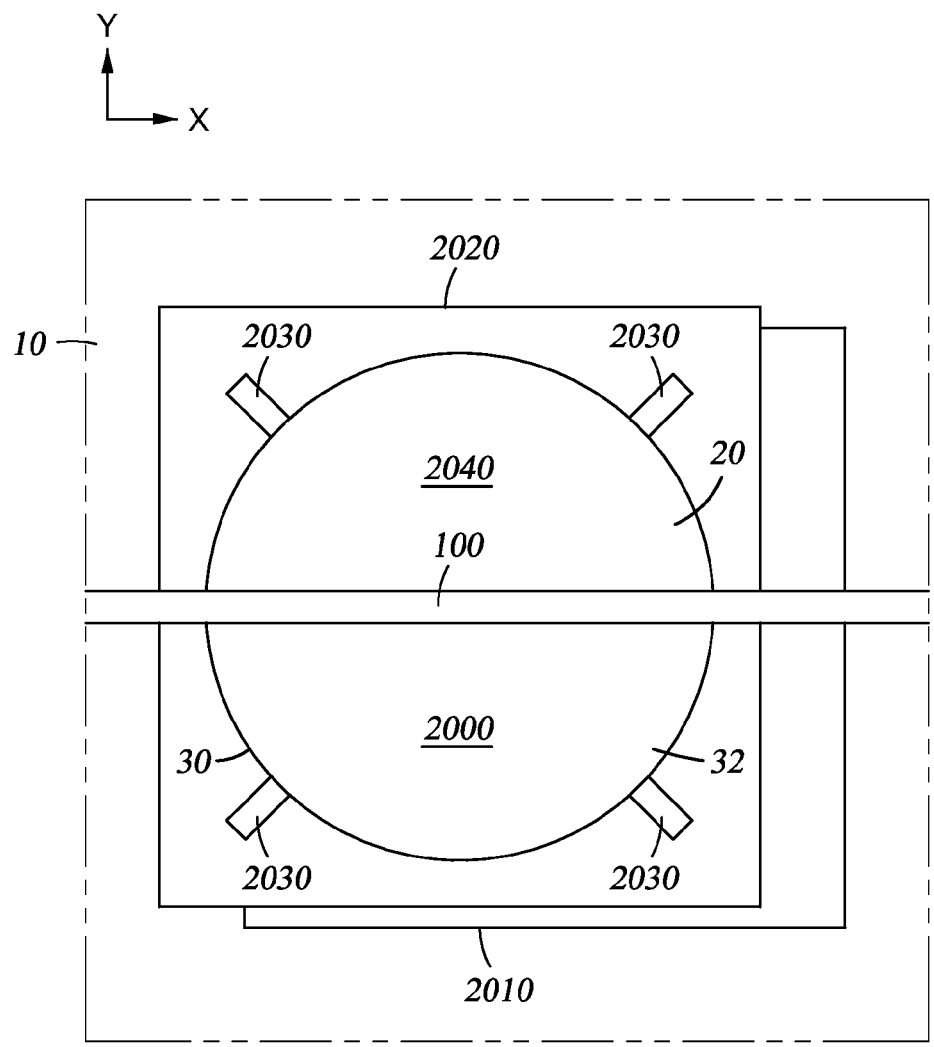
FIG. 22 is a plan view of one embodiment of the workpiece support of FIG. 1, schematically illustrating an alternative tip plate.

Referring now to FIG. 22, another configuration of the tip array is shown schematically. In this embodiment, the tip plate 100 is in the form an extended linear array, for example 80 rows of tips each on the order of 12.5 million tips long. Continuing the spacing and sizing of the tips in the 2 mm by 2 mm tip plate, the tip plate in this embodiment is on the order of 250 mm long and 2400 nm wide. In this embodiment, the tip plate 110 may be of sufficient length to overlie the entire workpiece 30 as shown in FIG. 22, thus reducing the scanning distance of the workpiece in x-direction of the Figure.

Referring now to FIGS. 23 to 29, the effect of the process sequence for preparing a tip plate of the present invention is shown. Beginning at FIG. 23, a substrate 1000, having a drive circuit formed thereon including a plurality of interconnects (wires) 1002 terminating therein is covered with a hardmask layer 1004, such as a silicon nitride material, and a photoresist layer 1006 is formed thereover. In the Figure, the photoresist layer 1006 has been exposed, such as by e-beam lithography, to open a feature 1003 in the resist, and the underlying hardmask is pattern etched through the feature to define opening 1008 therein between the underlying interconnects 1002 embedded in the substrate 1000. The interconnects 1002 may be formed prior to forming the tips 130, such as by etching deep vias into a substrate, and terminating them inwardly of the final surface of the substrate on which the tips 130 will be formed. Additionally, the transistor array may be formed in the substrate before or after forming the tip array. The substrate may then be ground on its back or reverse surface, to a desired spacing between the back surface and the ends of the interconnect 1002, followed by formation of the tips 130 on the back side of the substrate. Alternatively, an epitaxial layer may be grown on the front or rear surface of the substrates, and the tips 130 formed therein. In the figure, the substrate may comprise silicon or doped silicon. Alternatively, the substrate may include a silicon substrate on which the interconnects 1002 may be formed, over which a non-porous lithium aluminum silicon oxide glass ceramic characterized by evenly-distributed nano-crystals within a residual glass phase, such as Zerodur™ sold by Schott glass has been formed. The non-porous lithium aluminum silicon oxide glass ceramic layer may be formed directly on the substrate, or adhered thereto, such that the interconnects 1002 extend inwardly of the non-porous lithium aluminum silicon oxide glass ceramic layer. This structure will provide higher thermal dimensional stability over a temperature range than will a silicon based tip. As described herein with respect to a silicon substrate 1000, the non-porous lithium aluminum silicon oxide glass ceramic layer may be etched as described herein to provide the individual, nanometer scaled, array of tips.

Figure 23:
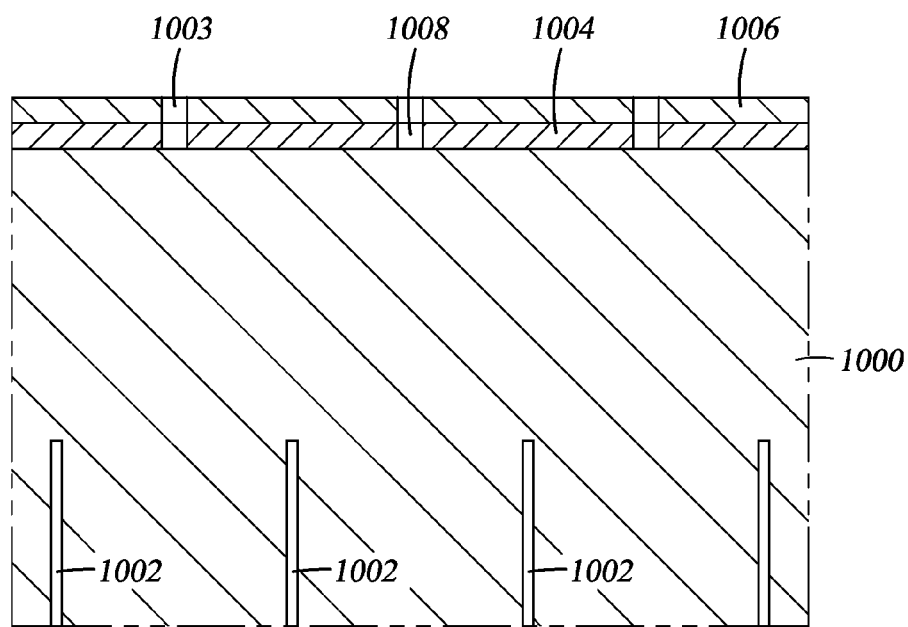
FIG. 23 is a partial sectional view of a portion of a precursor to a tip plate, wherein a patterned masking material is formed over the material from which the tips will be formed.
Figure 24:
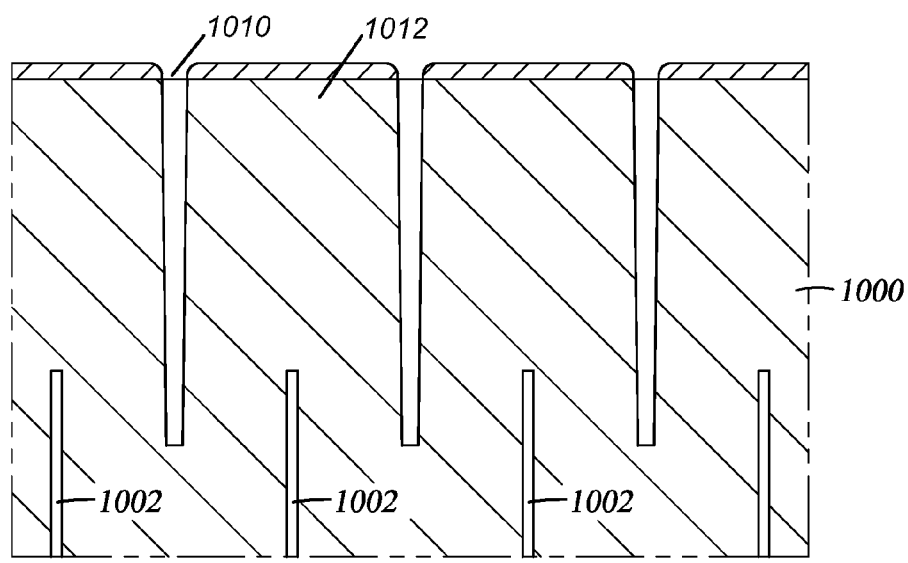
FIG. 24 is a partial sectional view of a portion of a precursor to a tip plate, wherein an isolation trench has been formed into the material from which the tips will be formed.
Figure 25:
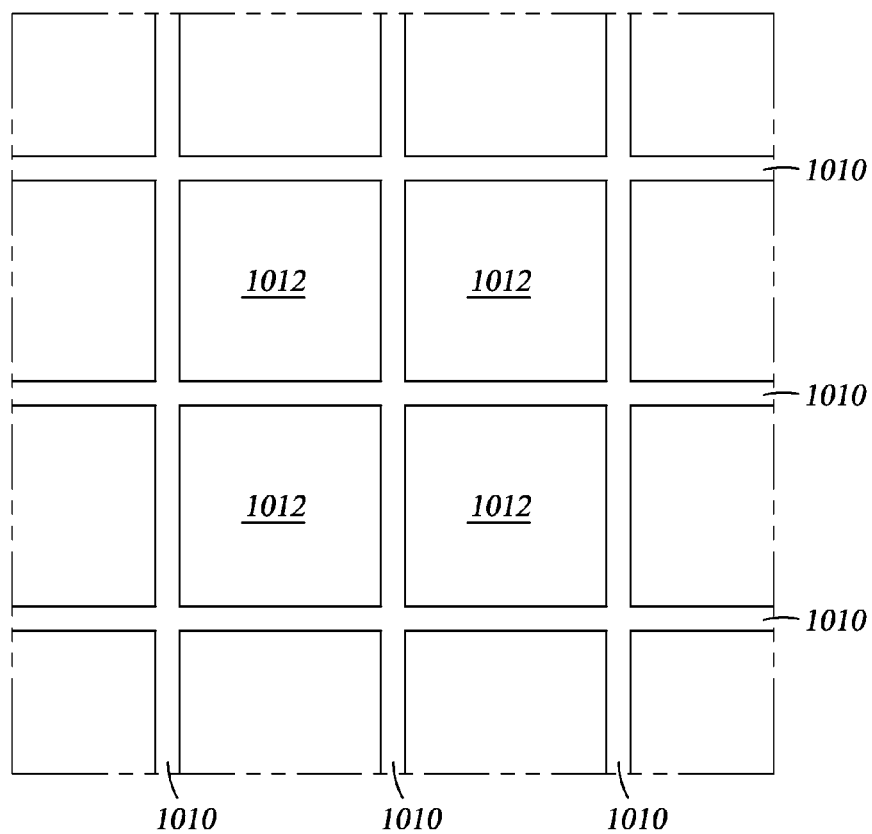
FIG. 25 is a plan view of the portion of the precursor of a tip plate shown in section in FIG. 24 showing the outline of a trench formed therein.
Figure 26:
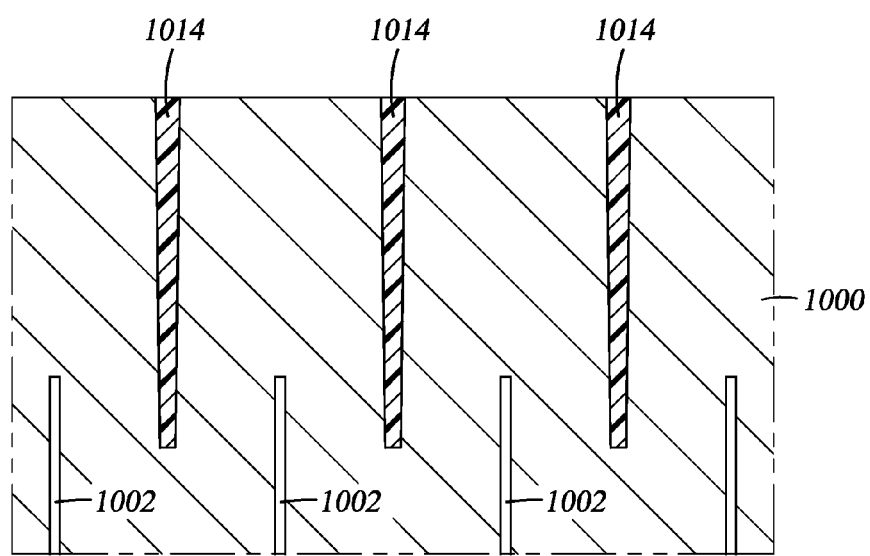
FIG. 26 is a partial sectional view of a portion of a precursor to a tip plate, wherein an isolation trench has been filled with an isolation material.

The structure of FIG. 23 is exposed to an etchant in a plasma etch chamber wherein anisotropic etching is performed to form trenches 1010 in the substrate 1000, leaving isolated mesas 1012 surrounded thereby as is shown in FIGS. 24 and 25. The trenches 1010 terminate in the substrate 1000 at a location below the terminus of the interconnects 1002, i. e., the interconnects extend inwardly of the mesas 1010. Thereafter, as is shown in FIG. 26, the trenches are filled with an isolating material 1014, such as silicon nitride.

Figure 27:
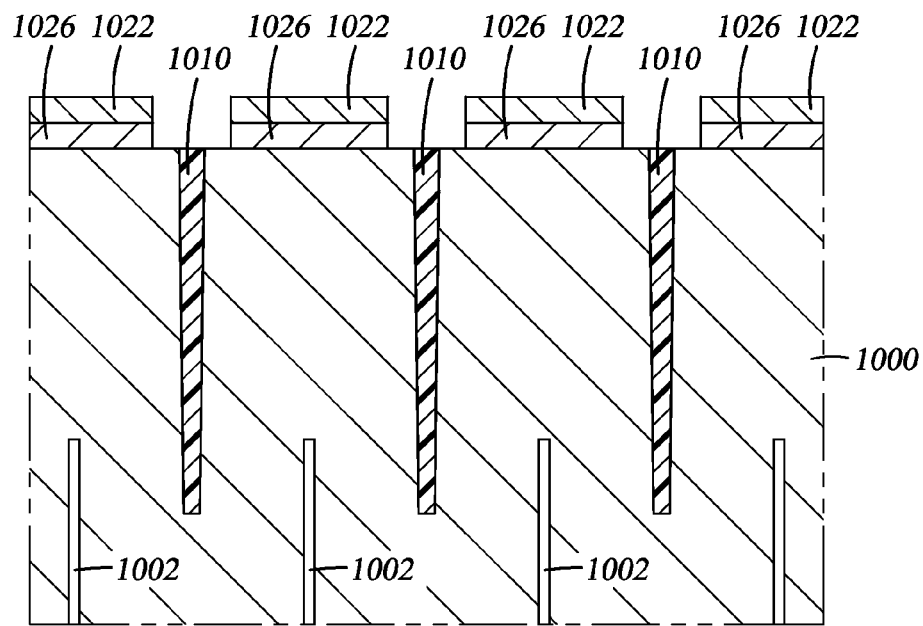
FIG. 27 is a partial sectional view of the portion of a precursor to a tip plate of FIG. 26, wherein a patterned masking material has been formed thereon.

After forming the isolating trenches 1012, the substrate 1000 is covered with a hardmask 1020 material such as silicon nitride, which may be formed thereon during the filling of the isolation trenches 1010, and a photoresist 1022 is again formed over the hardmask 1020 material and patterned, followed by etching of the hardmask material as shown in FIG. 27. The resulting structure has a generally circular in cross section layer of silicon nitride hardmask 1026 remaining in the center of each mesa 1012, and the silicon nitride isolating material 1014 remaining but exposed through the opening in the hardmask 1020 in the isolation trenches 1010.

Figure 28:
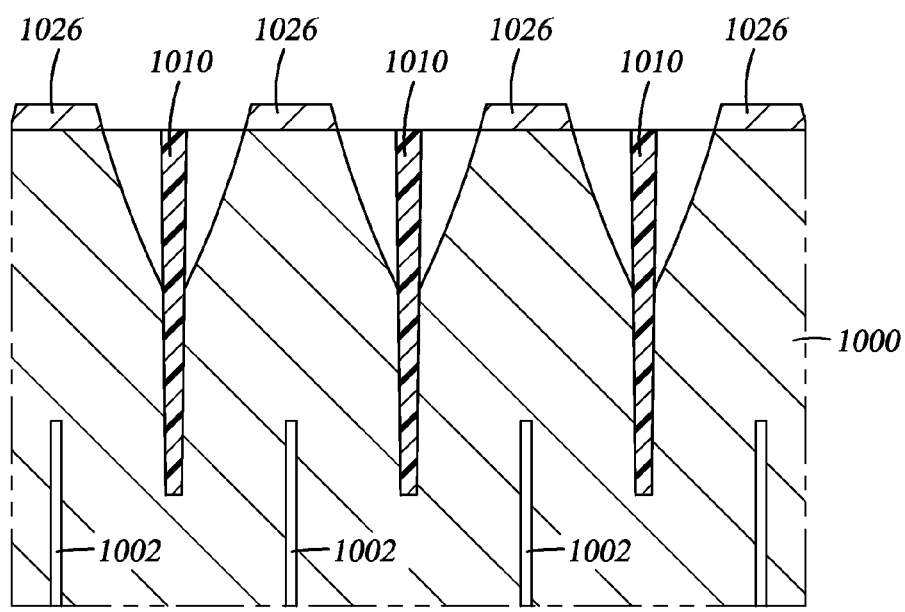
FIG. 28 is a sectional view of the portion of a precursor to a tip plate of FIG. 27, showing individual tips forming during etching of the patterned masking material.
Figure 29:
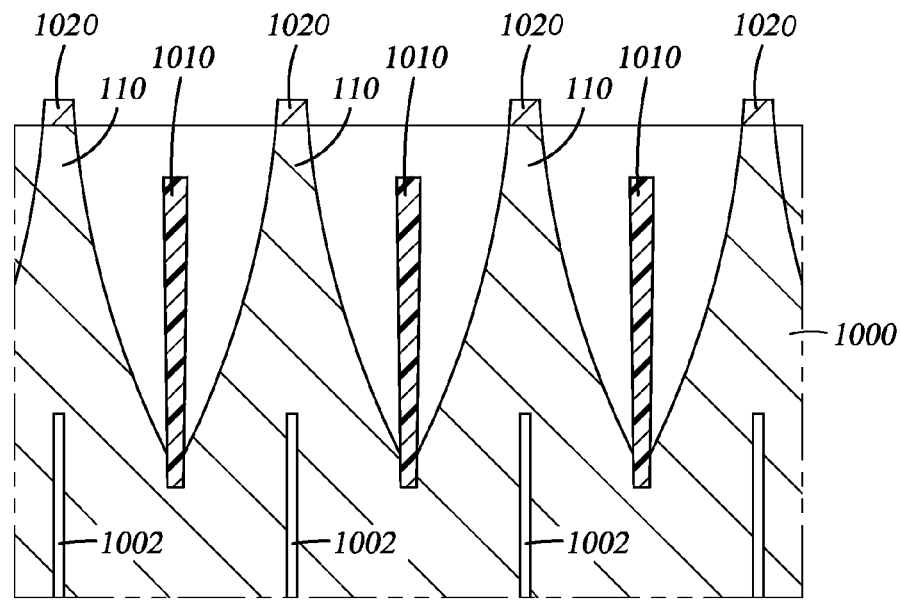
FIG. 29 is a sectional view of the portion of a precursor to a tip plate of FIG. 27, showing individual tips formed therein.

Thereafter, the underlying substrate is anisotropically etched in a plasma etch chemistry selected to etch the underlying mesa 102 material faster than the overlying hardmask 1020 material. As a result, as shown in FIG. 28, as etching progresses, the cross section of the hardmask becomes reduces by chemical etching, as does its thickness, but the etching of the exposed mesa 1012 material proceeds at a much faster rate, defining a conical structure in the mesa, a precursor to the individual tips 100, and reducing the height of isolating material 1014 surrounding each mesa 1012. As etching progresses, individual tips 110 are formed, each having an end of an interconnect 1002 extending therein, and isolated from an adjacent tip 100 by isolation material 1014 as shown in FIG. 29. Thus, each tip 110 is independently addressable through an interconnect 1002, and isolate from each adjacent, independently addressable tip 100. In the above description, the substrate material is silicon, and the interconnect material may be a metal such as tungsten or a doped polysilicon. To remove the remaining silicon nitride hardmask, and the isolating silicon nitride material extending between the tips 110, the structure of FIG. 29 is exposed to an etchant highly selective to silicon nitride over silicon, such as an $N_2$ O plasma to which small amounts of a fluorine based chemistry, such as CF or NF, resulting in a 40 to 1 resulting in a high degree of etching of the silicon nitride hardmask 1026 and isolation material 1010, and minimal etching of silicon of the tip 110, to yield the result of FIG. 30. In addition, FIG. 30 shows a spin on hardmask material 1140 applied to the structure, filling the space between the tips 110, but formed such that the individual tips 110 extend slightly outwardly therefrom.

Figure 30:
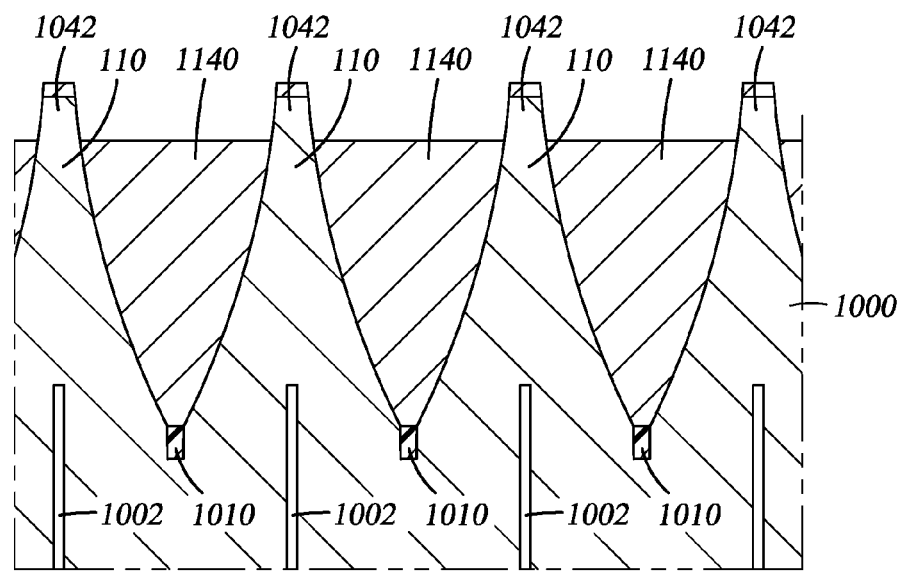
FIG. 30 is a sectional view of the tip array of FIG. 29, showing a spin on protective coating formed thereover to leave only the ends of the individual tips exposed.
Figure 31:
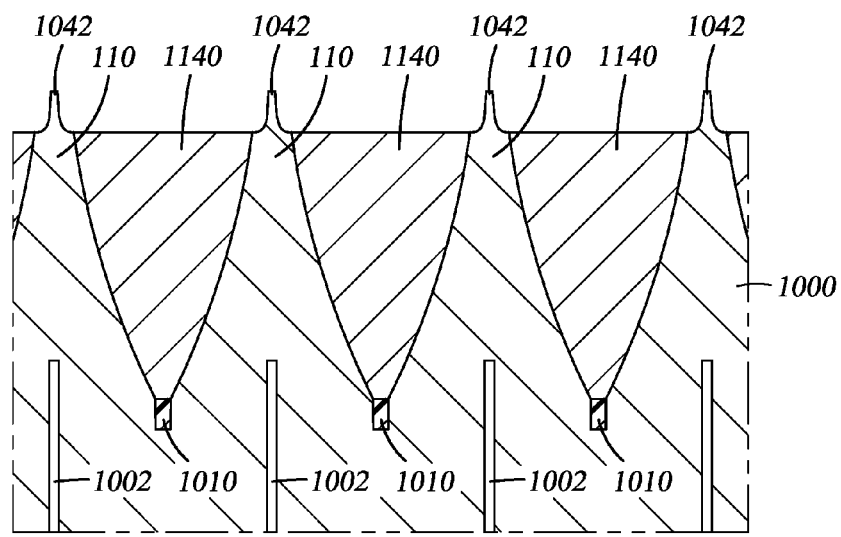
FIG. 31 is a sectional view of the tip array of FIG. 30, after further processing of the ends of the tips.

Thereafter, If further reduction of the tip size at the end 1030 is desired, the structure shown in FIG. 29 may be further coated, such as by a spin on resist, to leave only the ends 1030 of the tips 110 exposed as shown in FIG. 30, and further etching in a plasma etch environment may be performed to further reduce the diameter of the end 1030 of the tips 110 as shown in FIG. 31.

The tip plate 100 and transistor array for individually addressing a bias to each tip 110 in the array are formed in a single substrate, such as a silicon wafer. The transistor array may be formed directly over the tip plate 100, or may extend from the periphery thereof, as is known in the art for controlling the reading and writing of an integrated circuit memory device.

Figure 32:
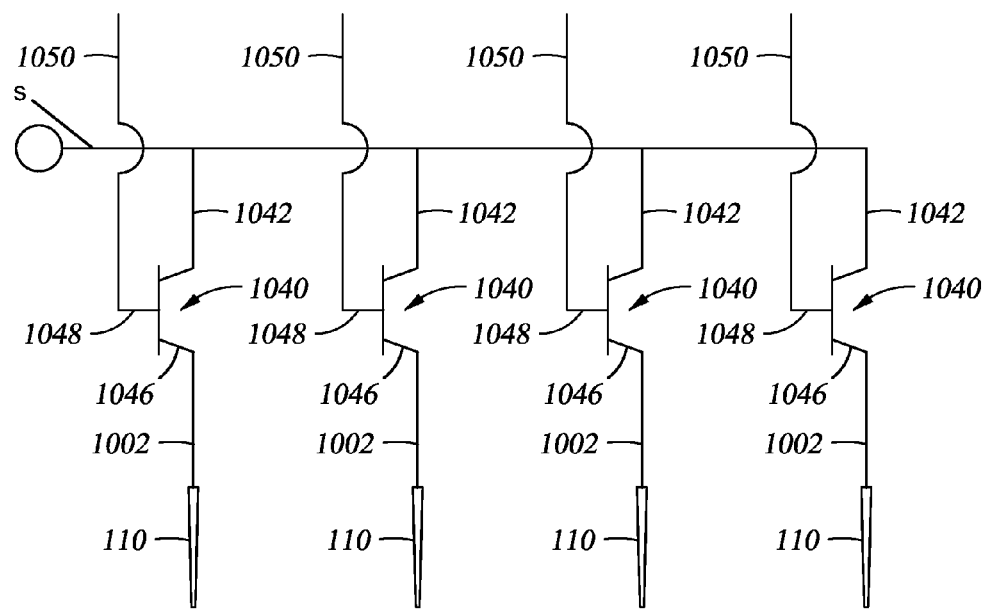
FIG. 32 is a schematic view of a drive circuit for several individual tips of the tip array.

As shown in FIG. 32, a series of individual transistors 1040 are arrayed along the length direction of several tips 110 A source line S extends across the series of transistors and is interconnected to the source 1042 of each transistor 1040. The drain 1046 of each transistor is connected, through interconnect 1002, to an individual one of tips 110. The gate 1048 of each transistor 1040 is independently connected to an individual gate line 1050, each of which may be independently addressed to allow the source 1042 to bias the interconnect 1002. Alternatively, the source and drain connections of the transistor may be switched, with the source connected to the interconnect and the drain connected to the source line.

Although the formation of features by deposition to the full feature size by repeated positioning of the probe array and energizing of the tips in the presence of a deposition reactant, the features may be formed by depositing a the outline of the features on the substrate in one or several passes of the tips over the feature locations in the presence of the deposition precursor, and then forming the full feature by selective deposition of a material on the partially formed feature. For example, a tungsten feature may be formed by the tip array, and then the substrate may be moved into a tungsten chemical vapor deposition chamber where it is exposed to decomposed tungsten hexafluoride and tungsten selectively deposits over the previously partially formed tungsten feature.

The embodiments herein provide a tip array having individual tips therein, wherein the bias on each tip in the array may be selectively biased or not biased as the tip array is spaced over a workpiece. By biasing an individual tip spaced from the workpiece, a portion of the workpiece directly underlying (approximately the portion of the substrate shadowed by the tip) may be modified by the presence of the electric field at the end of the tip. This modification can be a direct modification of the workpiece surface, such as causing a reaction among materials at the surface, or reactant(s) may be introduced between the tip and the workpiece, and the potential on the tip causes a reaction of the reactants to cause the modification. As described herein, ALD reactions, chemical reactant deposition reactions and workpiece material etching reactions are all enabled by the embodiments. However, other reactions, such as direct modification of the material on or of the workpiece surface, such as direct etching of the workpiece, or changing of a property of the workpiece surface such as causing reactants of dopant materials with the workpiece surface to form junctions, such as p-n junctions, are also enabled hereby, all at a scale on the order of nanometers. By moving the tip array and selectively biasing tips in desired patterns as the tip array is moved over the workpiece, lines, pillars and other three dimensional features can be written or formed, again on a scale of nanometers, potentially as small as a single atom.

The tip arrays may be manufactured using traditional semiconductor and MEMS manufacturing techniques, using e beam lithography to pattern resist materials only for the smallest features thereof. Multiple tip arrays may be formed on a single substrate, for example a silicon substrate, and the transistor array and logic circuitry for driving individually addressing the tips may be formed in the same substrate, before or after, or in some fabrication process steps, simultaneously with steps forming the tip array. Thus, for tip arrays on the order of several mm square, the tip array portion may form only part of the device, and a peripheral area of the same substrate may include logic circuitry, and some or all of the transistor array. Thus, multiple such devices may be formed simultaneously on a semiconductor substrate, enabling volume manufacturing of tip arrays.

We claim:

1. A method of forming a tip plate useful for the direct formation of features on a workpiece, comprising;
    providing a substrate;
    forming a plurality of interconnects terminating therein;
    forming a plurality of transistors on or in the substrate, and connecting a source or drain of a transistor of the plurality of transistors to an interconnect of the plurality of interconnects; and
    pattern etching the substrates to form tips having an alignment such that an individual tip is formed over each interconnect.

2. The method of forming a tip plate of claim 1, further including the step of forming an isolation trench around each tip.

3. The method of forming a tip plate of claim 2, wherein the isolation trench is formed before the tip is formed.

4. The method of claim 2, wherein the isolation trench extends inwardly of the substrate beyond the terminus of the interconnect in the substrate.

5. The method of forming a tip plate of claim 4, wherein the isolation trench is formed by anisotropic etching.

6. The method of forming a tip plate of claim 1, wherein the substrate comprises silicon or doped silicon.

7. The method of forming a tip plate of claim 1, wherein the plurality of interconnects are made of a metal or doped polysilicon.

8. A method of forming a tip plate useful for the direct formation of features on a workpiece, comprising;
    providing a substrate;
    forming a plurality of interconnects terminating therein;
    forming a plurality of transistors on or in the substrate, and connecting a source or drain of a transistor of the plurality of transistors to an interconnect of the plurality of interconnects;
    pattern etching the substrates to form tips having an alignment such that an individual tip is formed over each interconnect; and
    forming an isolation trench around each tip of the tips, wherein the isolation trench is formed by anisotropic etching.

9. The method of forming a tip plate of claim 8, wherein the isolation trench is formed before the tip is formed.

10. The method of claim 8, wherein the isolation trench extends inwardly of the substrate beyond the terminus of the interconnect in the substrate.

11. The method of forming a tip plate of claim 8, wherein the substrate comprises silicon or doped silicon.

12. The method of forming a tip plate of claim 8, wherein the plurality of interconnects are made of a metal or doped polysilicon.

13. A method of forming a tip plate useful for the direct formation of features on a workpiece, comprising;
    providing a substrate wherein the substrate comprises silicon or doped silicon;
    forming a plurality of interconnects terminating therein, wherein the plurality of interconnects are made of a metal or doped polysilicon;
    forming a plurality of transistors on or in the substrate, and connecting a source or drain of a transistor of the plurality of transistors to an interconnect of the plurality of interconnects; and
    pattern etching the substrates to form tips having an alignment such that an individual tip is formed over each interconnect.

14. The method of forming a tip plate of claim 13, further including the step of forming an isolation trench around each tip.

15. The method of forming a tip plate of claim 14, wherein the isolation trench is formed before the tip is formed.

16. The method of claim 14, wherein the isolation trench extends inwardly of the substrate beyond the terminus of the interconnect in the substrate.

17. The method of forming a tip plate of claim 16, wherein the isolation trench is formed by anisotropic etching.

* * * * *